United States Patent [19]

Lee

[11] Patent Number: 5,661,063
[45] Date of Patent: Aug. 26, 1997

[54] SEMICONDUCTOR MEMORY DEVICE PROVIDED WITH CAPACITORS FORMED ABOVE AND BELOW A CELL TRANSISTOR AND METHOD FOR MANUFACTURING THE SAME

[75] Inventor: Joo-young Lee, Seoul, Rep. of Korea

[73] Assignee: Samsung Electronics Co., Ltd., Suwon, Rep. of Korea

[21] Appl. No.: 543,865

[22] Filed: Oct. 19, 1995

Related U.S. Application Data

[62] Division of Ser. No. 440,380, May 12, 1995.

[30] Foreign Application Priority Data

May 13, 1994 [KR] Rep. of Korea ............... 94-10487

[51] Int. Cl.$^6$ ..................................... H01L 21/70
[52] U.S. Cl. ................................. 437/32; 437/919
[58] Field of Search ................ 437/52, 56, 919; 257/306, 309

[56] References Cited

U.S. PATENT DOCUMENTS

| | | |
|---|---|---|
| 5,436,185 | 7/1995 | Hsue et al. ............... 437/48 |
| 5,439,840 | 8/1995 | Jones, Jr. et al. ......... 437/52 |
| 5,573,967 | 11/1996 | Tseng .................... 437/52 |
| 5,585,284 | 12/1996 | Park ..................... 437/21 |

*Primary Examiner*—John Niebling
*Assistant Examiner*—Joni Y. Chang
*Attorney, Agent, or Firm*—Cushman Darby & Cushman, IP Group of Pillsbury Madison & Sutro LLP

[57] ABSTRACT

A semiconductor memory device provided with capacitors formed above and below a cell transistor includes first and second transistors formed in a first level, a first storage electrode connected to the first transistor and formed below the first level, and a second storage electrode connected to the second transistor and formed above the first level. The first and second storage electrodes are connected to each source via a spacer formed on the sidewalls of each source, and undercuts are formed between the storage electrode and the transistor, to thereby obtain double or more cell capacitance, stable cell transistor characteristic and reduced short-channel effects.

5 Claims, 26 Drawing Sheets

FIG. IA (PRIOR ART)
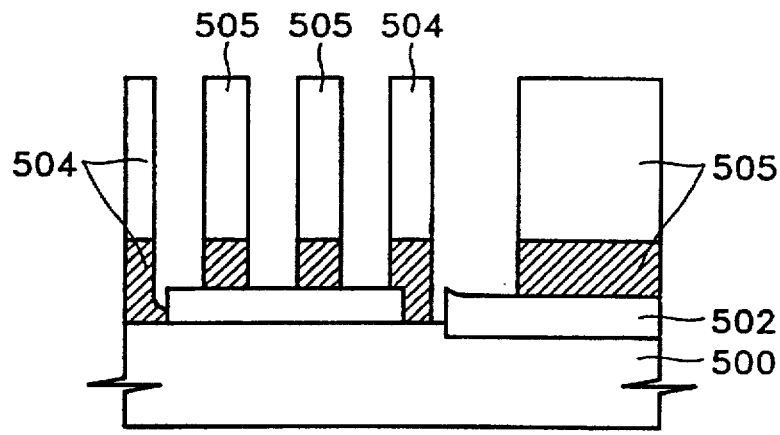
FIG. IB (PRIOR ART)
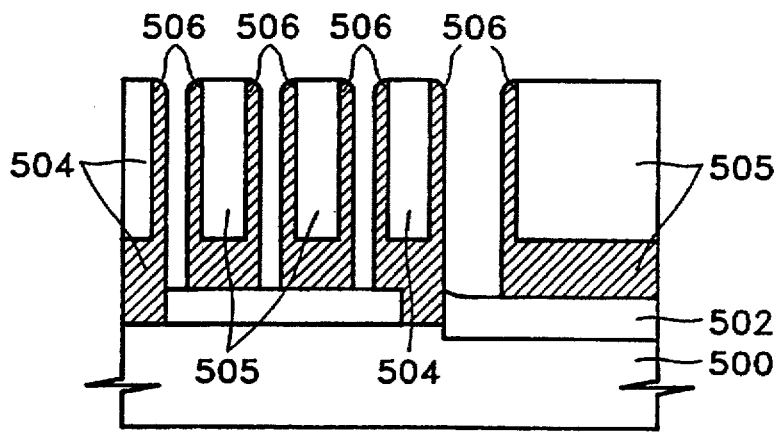
FIG. IC (PRIOR ART)
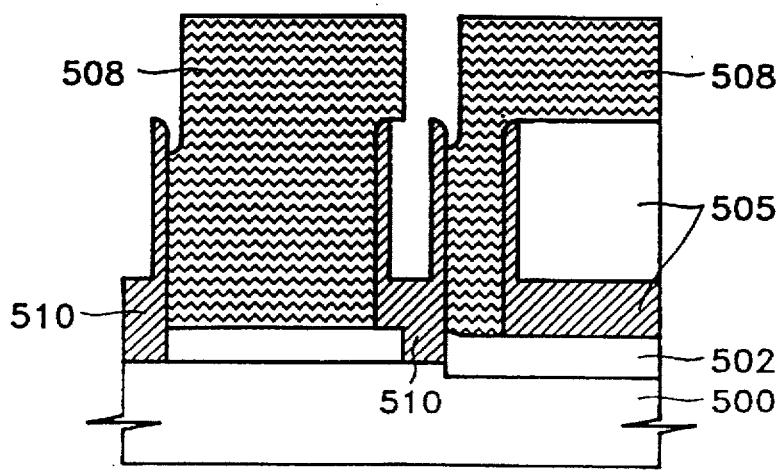

1

SEMICONDUCTOR MEMORY DEVICE PROVIDED WITH CAPACITORS FORMED ABOVE AND BELOW A CELL TRANSISTOR AND METHOD FOR MANUFACTURING THE SAME

This is a division of application Ser. No. 08/440,380, filed May 12, 1995.

BACKGROUND OF THE INVENTION

The present invention relates to a semicondutor memory device. More particularly, the present invention relates to a DRAM memory device provided with capacitors formed above and below a cell transitor, and a method for its manufacture.

Recently, there have been many studies for improving the structure of a stacked capacitor cell and a trench capacitor cell for DRAM devices of 256 Mb and beyond. However, it is still very difficult, despite an extremely complicated manufacture process, to ensure sufficient cell capacitance in a DRAM cell having a 1.5 V operation voltage and 0.5 $\mu m^2$ cell size.

Further, in a layout having sufficient alignment margin, either the cell having a feature size smaller than the current minimum feature size, or the storage electrode must have a height larger than the current height. The small cell size is almost impossible to obtain because of limits in current photo-etching processes, and the increased storage electrode-height problem in manufacturing.

In addition, as the impurity concentration of the source and drain of the metal-oxide semiconductor (MOS) device becomes high, the junction leakage current gradually becomes larger, thereby causing data storage problems.

FIGS. 1A–1E are section views showing a method for manufacturing a DRAM having a buried capacitor (see "A Buried Capacitor DRAM Cell with Bonded SOI for 256M and 1 Gbit DRAMs" by Toshiyuki Nishihara et al., IDEM, 1992, pp803–806), for solving the above-described problems.

Here, a trench for forming a cell separating insulation film is formed on silicon substrate 500, and $SiO_2$ film is deposited thereon and etched, to thereby form cell-separating insulation film 502. Subsequently, polysilicon/$SiO_2$ pillars 504 are formed in order to form a storage electrode connected to the substrate. Meanwhile, in a peripheral region, i.e., the region where the storage electrode is not formed, dummy patterns 505 are formed to compensate for the height of pillars 504 (FIG. 1A).

Next, polysilicon is deposited all over the resultant structure on which the pillars and dummy patterns are formed. Then, the polysilicon is etched back, to thereby form spacer 506 on the sidewalls of the pillars (FIG. 1B).

After the peripheral region is covered with photoresist pattern 508, the $SiO_2$ portion of each pillar is removed using HF solution. As a result, 1.6 $\mu m$-high storage electrode 510 is formed (FIG. 1C).

A dielectric film 512 and plate electrode 514 are then formed. Subsequently, polysilicon buffering layer 516 is deposited and etched back, to thereby planarize the surface thereof. Then, support wafer 518 is bonded to the buffering layer 516 (FIG. 1D).

Lastly, the rear surface of silicon substrate 500 is polished, thereby leaving active region 520 of 80 nm between each cell-separating insulation film 502 (FIG. 1E).

According to the above disclosure, a cell capacitor is formed below an active region and completely buried so that the degree of planarization of a word line and bit line formed in a subsequent process can be improved. In addition, the margin for forming a storage electrode is slightly increased. However, there are certain drawbacks to this method.

First, for the case of a cylindrical storage electrode, the height of the storage electrode has to be above 1.5 $\mu m$ in order to ensure sufficient cell capacitance with the limited cell size.

Second, the process becomes more difficult because a dummy pattern is needed.

Third, since a contact hole for connecting a storage electrode to an active region and a contact hole for connecting a bit line to an active region are formed together in a limited active region, the contact hole size and channel length are reduced. As a result, contact resistance increase and a short channel pattern are generated, which may cause a serious problem in the operation of the device.

Fourth, if a storage electrode that repeats charge/discharge is formed above a transistor, operational characteristics of the transistor are unstable due to the charge/discharge. Therefore, it is desirable to form a storage electrode avoiding the region where the transistor is to be formed. As for the Nishihara et al. invention, when a folded bit line structure (where a bit line is formed lengthwise and a word line is formed crosswise of an active region) is adopted to stabilize operational characteristics of the transistor, cell size in the word line direction becomes 0.3 $\mu m$ to 0.4 $\mu m$. Thus, an area occupied by a cell capacitor becomes extremely small, which causes great difficulty in ensuring sufficient cell capacitance. Accordingly, to ensure sufficient cell capacitance, a more complicated process is needed or the storage electrode height has to be increased.

SUMMARY OF THE INVENTION

Accordingly, it is a first object of the present invention to provide a semiconductor memory device having capacitors formed above and below a cell transistor, so as to overcome the drawbacks of the conventional art.

It is a second object of the present invention to provide a semiconductor memory device having capacitors formed above and below a cell transistor, in which cell capacitance of at least twice that of a conventional cell can be obtained.

It is a third object of the present invention to provide a method for manufacturing the above described semiconductor memory device.

To accomplish the first and second objects, there is provided a semiconductor memory device provided with capacitors formed above and below a cell transistor, comprising: first and second transistors formed in a first level; a lower storage electrode connected to the first transistor and formed below the first level; and an upper storage electrode connected to the second transistor and formed above the first level.

In one an embodiment, the transistors have a silicon-on-insulator (SOI) structure, and each storage electrode is connected to each transistor via a spacer formed on the sidewalls of the source of each transistor.

The upper storage electrode and the lower storage electrode partially overlap. An undercut is formed between the storage electrodes and the transistors.

To accomplish the first and second objects of the present invention, there is provided a semiconductor device provided with capacitors formed above and below a cell transistor, comprising: first and second active regions separately formed; a first transistor whose source is formed in an edge portion of the first active region and a second transistor whose source is formed in an edge portion of the second active region; a first spacer formed on the sidewalls of the source of the first transistor and a second spacer formed on the sidewalls of the source of the second transistor; and a lower storage electrode connected to the first spacer and an upper storage electrode connected to the second spacer.

In another embodiment, the transistor has a silicon-on-insulator (SOI) structure and an undercut is formed between the storage electrodes and the transistors.

In addition, the storage electrodes are connected to the spacers via pads, and bit lines connected to drains constituting the transistors are positioned between the active regions. Here, the bit lines are connected to the drains via pads.

In still another embodiment, bit lines connected to the drains of the transistors are placed between the active regions. In addition, bit lines are connected to the drains of the transistor via pads.

To accomplish the third object of the present invention, there is provided a method for manufacturing a semiconductor memory device provided with capacitors formed above and below a cell transistor, comprising the steps of: (a) forming an insulation film pattern on a first substrate, etching the first substrate by using the insulation film pattern as an etching mask, and forming first and second active regions which are separated from each other and protruded; (b) forming a spacer on the sidewalls of the active regions; (c) removing the part of spacer other than the part of the spacer formed on the sidewalls of the region where the source of a transistor is to be formed, to thereby form a first spacer contacting the first active region and a second spacer contacting the second active region; (d) depositing an insulating material over the entire resultant structure and etching back the insulating material to thereby fill only the space between the active regions with the insulating material; (e) forming a first capacitor consisting of a first storage electrode connected to the first spacer, a first dielectric film and a first plate electrode on the resultant structure; (f) planarizing a surface of the first plate electrode; (g) forming an insulation film on the first plate electrode and bonding a second substrate with the resultant structure; (h) turning the first substrate upside down, etching back the first substrate such that the spacers and active regions can be exposed; (i) forming first and second transistors on the first and second active regions, respectively; and (j) forming a second capacitor consisting of a second storage electrode connected to the second spacer, a second dielectric film and a second plate electrode on the resultant structure.

In still another embodiment, a step for respectively forming a first pad connected to the second spacer and a second pad connected to the drain of a transistor, and a step for forming a bit line connected to the second pad and located between the active regions are included in the step (i).

As yet another embodiment, a step of forming only a first pad connected to the second spacer is further included in the step (i).

In still another another embodiment, a step of forming an insulation layer over the entire resultant structure is included in the step (d) and step (i). Here, the insulation layer is removed after forming the storage electrodes is completed.

According to a semiconductor memory device of the present invention and a method for manufacturing the same, cell capacitors connected with transistors are formed above and below an active region, to thereby increase are area occupied by the capacitor. As a result, cell capacitance is increased.

BRIEF DESCRIPTION OF THE DRAWINGS

The above objects and other advantages of the present invention will become more apparent by describing in detail preferred embodiments thereof, with reference to the attached drawings in which:

FIG. 1A to FIG. 1E are section views showing a method for manufacturing a DRAM having a buried capacitor, based on a conventional method;

DETAILED DESCRIPTION OF THE INVENTION

Figure 1D:
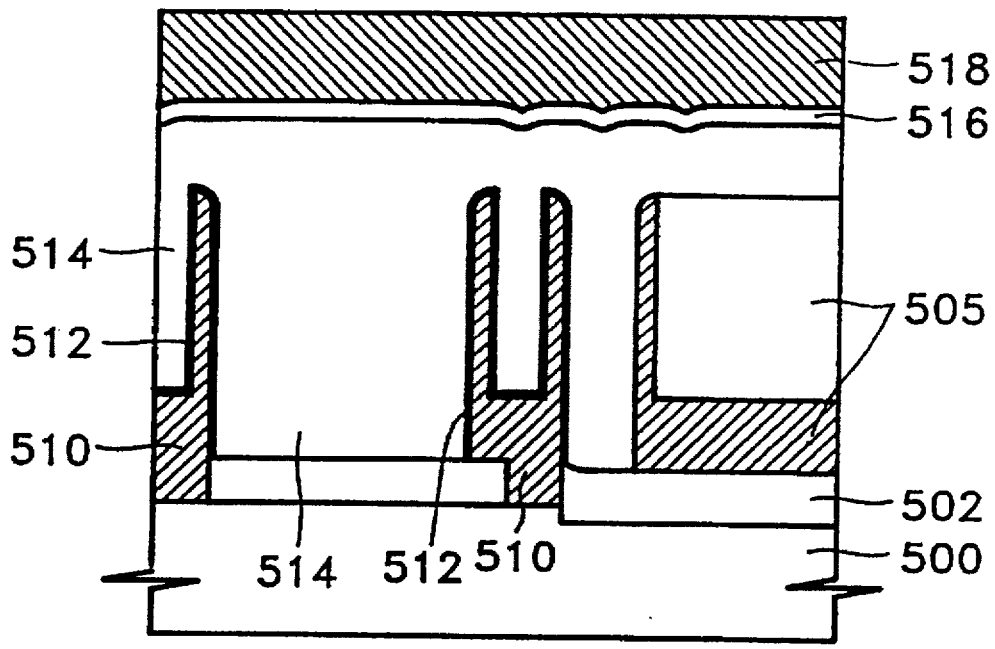
Figure 1E:
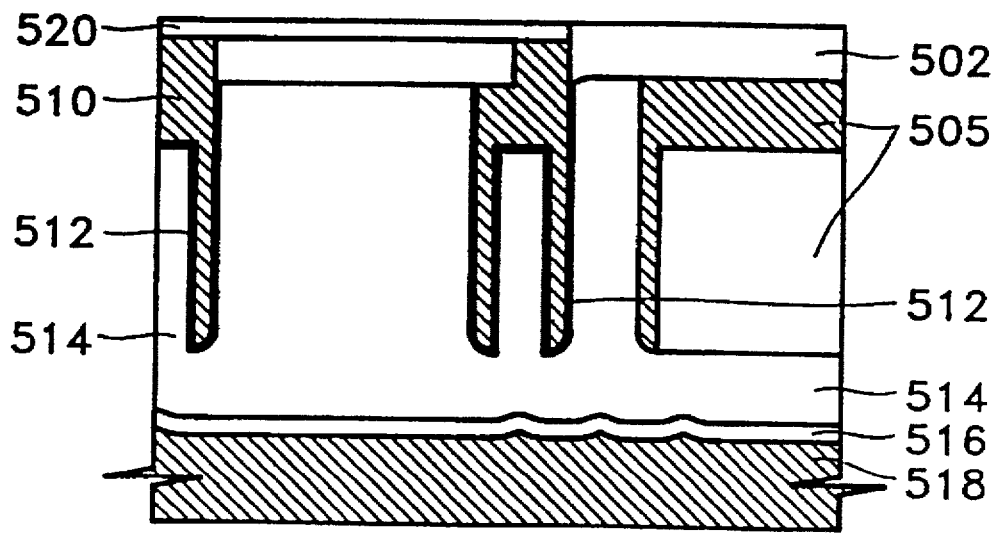
Figure 2A:
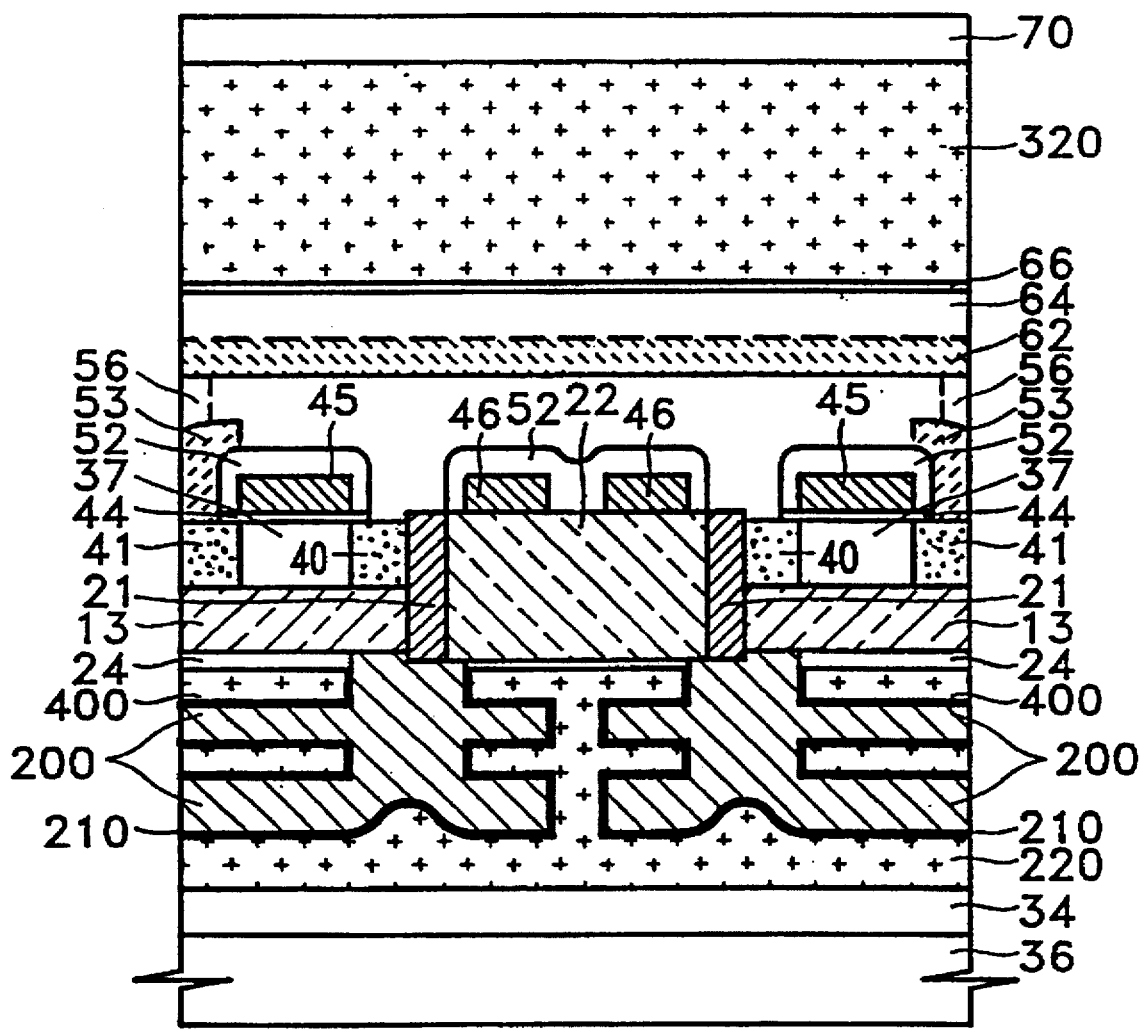
FIGS. 2A–2C are section views showing a DRAM having capacitors formed above and below a cell transistor and which is manufactured according to a first embodiment of the present invention.
Figure 2B:
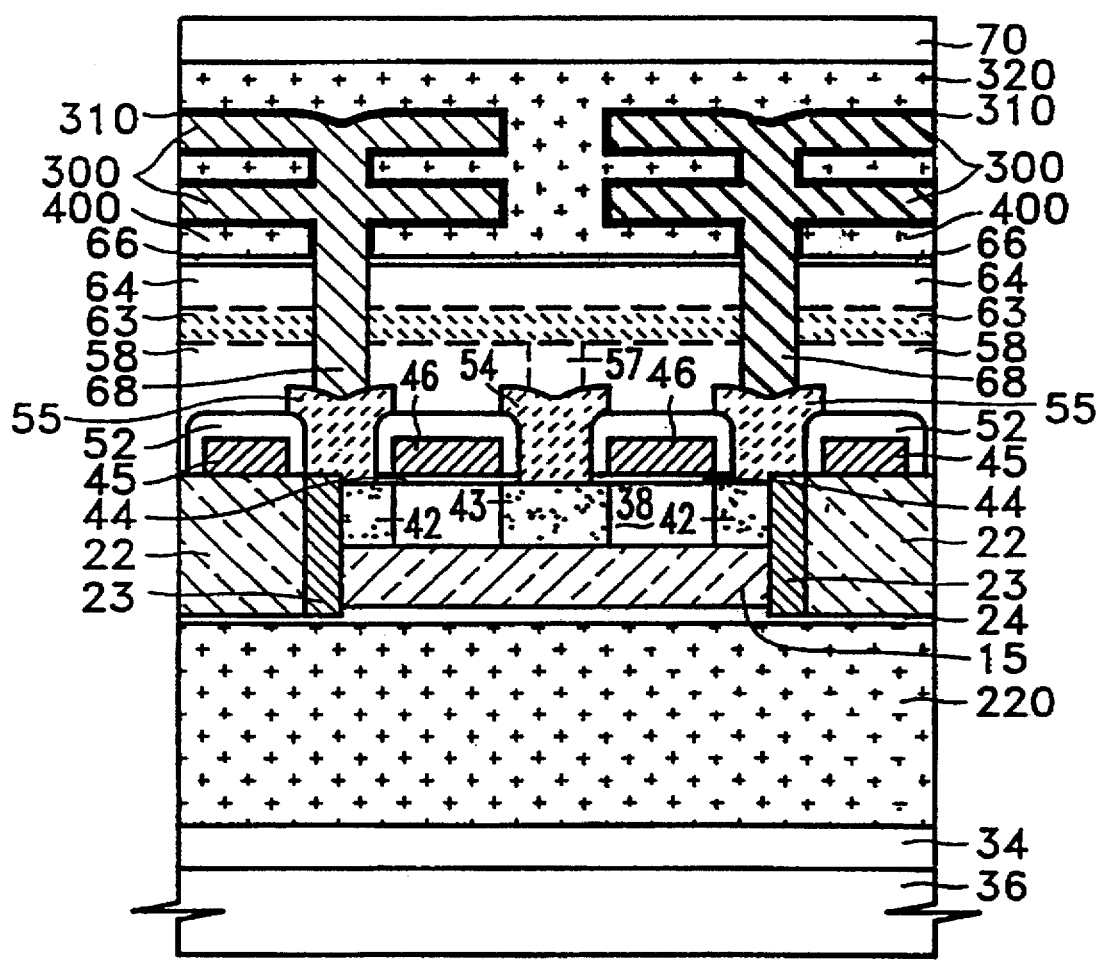
Figure 2C:
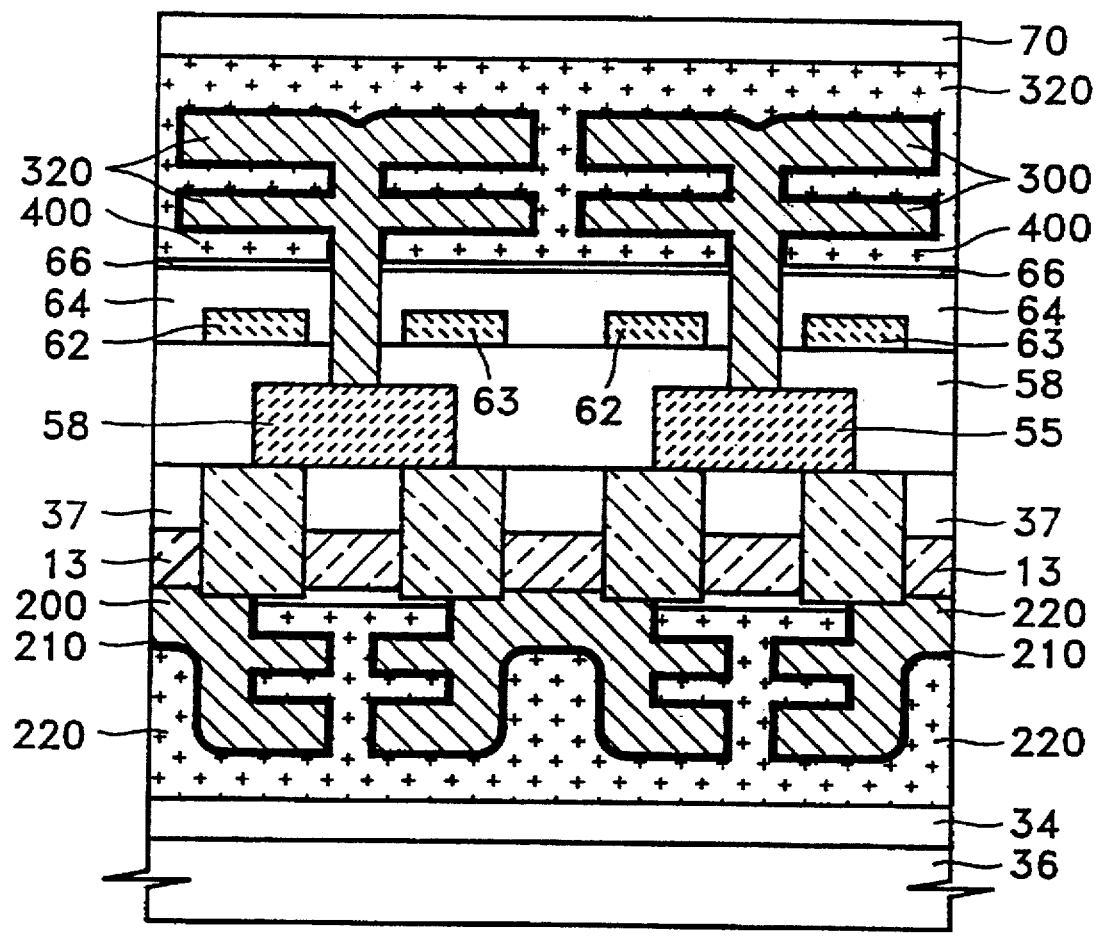

FIG. 2A to FIG. 2C are section views showing a DRAM having capacitors formed above and below a cell transistor and which is manufactured according to a first embodiment of the present invention.

The DRAM device, manufactured in accordance with a first embodiment of the present invention, includes a first transistor, formed in first active region 37, which and comprises first source 40, first drain 41 and first gate electrode 45; a second transistor, formed in second active region 38 formed at the same material level as first active region 37, which consists of second source 42, second drain 43 and second gate electrode 46; first spacer 21 connected to the sidewalls of first source 40; second spacer 23 connected to the sidewalls of second source 42; first active insulation film pattern 13 formed under the first active region 37; second active insulation film pattern 15 formed under second active region 38; first storage electrode 200 connected to first spacer 21 and formed under active insulation film patterns 13 and 15; first dielectric film 210 formed on the surface of the first storage electrode 200; first plate electrode 220 with planarized bottom surface formed on first dielectric film 210; insulating film 34 formed at the bottom surface of first plate electrode 220; second substrate 36 bonded with a bottom surface of insulating film 34; first pad 53 connected to first drain 41 and formed above the transistor; second pad 54 connected to second drain 43 and formed at the same level as first pad 53; third pad 55 connected to second source 42 and formed at the same level as first pad 53; first bit line 62 connected to first pad 53 and formed above first pad 53; second bit line 63 connected to second pad 54 and formed at the same level as first bit line 62; second storage electrode 300 connected to third pad 55 and formed above bit lines 62 and 63; second dielectric film 310 formed on the surface of the second storage electrode 300; and second plate electrode 320 formed on second dielectric film 310.

Here, reference numeral 44 denotes a gate insulation film, reference numeral 52 denotes an insulation film for insulating a gate electrode from another conductive layer, reference numeral 22 denotes an isolation region for insulating between active regions 37 and 38, reference numerals 58 and 64 each denote an interlayer insulating film, reference numerals 24 and 66 each denote an etching blocking film, and reference numeral 70 denotes a device protection film.

As showing FIG. 2C, cell capacitors are formed respectively above and below the first and second transistors which are formed at the same material layer. The capacitors formed above and below the transistor partially overlap.

As shown in FIG. 2A and FIG. 2B, storage electrodes 200 and 300 of each cell are connected to transistors of each cell via spacers 21 and 23 formed on the source sidewalls, and undercut 400 is formed at the bottommost surface of each storage electrode.

A memory device having an upper- and lower-level capacitor, in accordance with the present invention, has advantages as follows.

First, a cell capacitor is formed above and below a transistor thereby obtaining twice the cell capacitor area of a conventional DRAM. As a result, cell capacitance can be easily increased.

Second, a storage electrode is connected to a source via a spacer formed on the sidewalls of the source. Therefore, a contact hole area formed to connect the source of the cell transistor with the storage electrode is not needed in an active region. As a result, the corresponding channel length can be further ensured.

Third, an undercut is formed at the bottommost surface of each storage electrode. Therefore, a plate electrode fixed at a regular voltage, instead of a storage electrode which is repeatedly charged and discharged faces a cell transistor. As a result, cell transistor characteristics can be prevented from destabilization caused by the charge/discharge action of the storage electrode.

Next, a method for forming the memory device, according to the first embodiment of the present invention, will now be explained with reference to FIGS. 3A–3G, 4A–4G, 5A–5G and 6A–6G. Here, FIGS. 3A–3G are layouts showing a method for manufacturing the DRAM having an upper- and lower-level capacitor of the embodiment 1 according to manufacturing process sequence, and FIGS. 4A–4G, 5A–5G and 6A–6G are section views taken along lines IV—IV, V—V and VI—VI of FIGS. 3A–3G, respectively.

As shown by FIGS. 3A, 4A, 5A and 6A, a process sequence for forming first active insulation film pattern 13, second active insulation film pattern 15, first spacer 18 and second spacer 19 includes the steps of (a) forming sequentially first insulation film 12 and second insulation film 14 onto first substrate 10, (b) employing mask patterns 100 and 102 (marked by a dotted line) for forming first and second active regions, and performing a photo-etching process where the first and second insulation films 12 and 14 are used as etching objectives, to thereby form first and second active insulation film patterns 13 and 15 consisting of first and second insulation films 12 and 14, (c) performing an etching by employing the active insulation film patterns as an etching mask, to thereby form trench 17 onto the first substrate, (d) forming thermal oxide-film 16 on the exposed surface of the first substrate, (e) forming a first material layer over the entire resultant structure and anisotropically etching the first material layer, to thereby form a dummy spacer consisting of the first material layer on the sidewalls of active insulation film pattern 13 and 15 and trench 17, (f) forming etch blocking film pattern 20 for leaving only a dummy spacer contacting the region where the source of a transistor is to be formed, by employing mask patterns 104 and 106 (marked as a solid line) for forming first and second dummy spacers 18 and 19, and (g) employing etch blocking film pattern 20 as an etching mask and performing an etching process where the dummy spacer is used as the etching objective, to thereby leave first dummy spacer 18 (marked by hashed lines in mask pattern 104) on the sidewalls of first active insulation film pattern 13 and second dummy spacer 19 (marked as hashed lines in mask pattern 106) on the sidewalls of second active insulation film pattern 15.

Here, first insulation film 12 is formed by depositing an insulation material, for example, high-temperature oxide (HTO), to a thickness of about 2,000 Å. Second insulation film 14 is formed by depositing an insulation material, for example, silicon nitride (SiN), to a thickness of about 500 Å. The depth of trench 17 is approximately 2,000 Å. Thermal oxide film 16 is formed to a thickness of about 200 Å. The first material layer consists of undoped polysilicon. The dummy spacer is formed to a thickness of about 500 Å. Etch blocking film pattern 20 may consist of a photosensitive film. In addition, the anisotropic etching performed in step (e) employs an etching method such as chemical dry etching (CDE) or plasma etching.

Figure 3A:
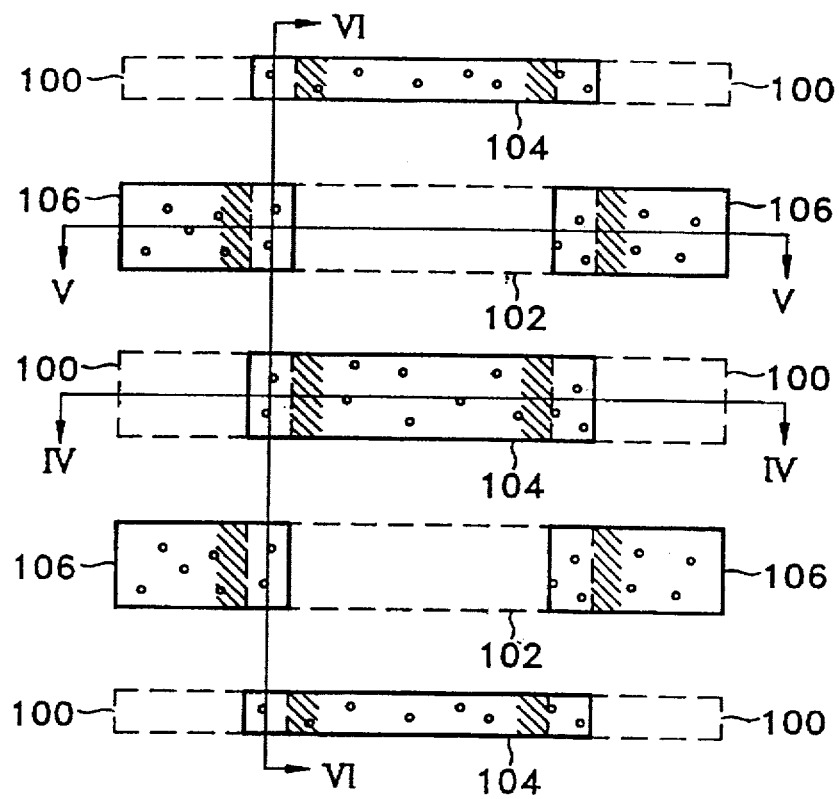
FIGS. 3A–3G are layout diagrams showing a method for manufacturing the DRAM of FIGS. 2A–2C, according to the manufacturing process sequence thereof.
Figure 3B:
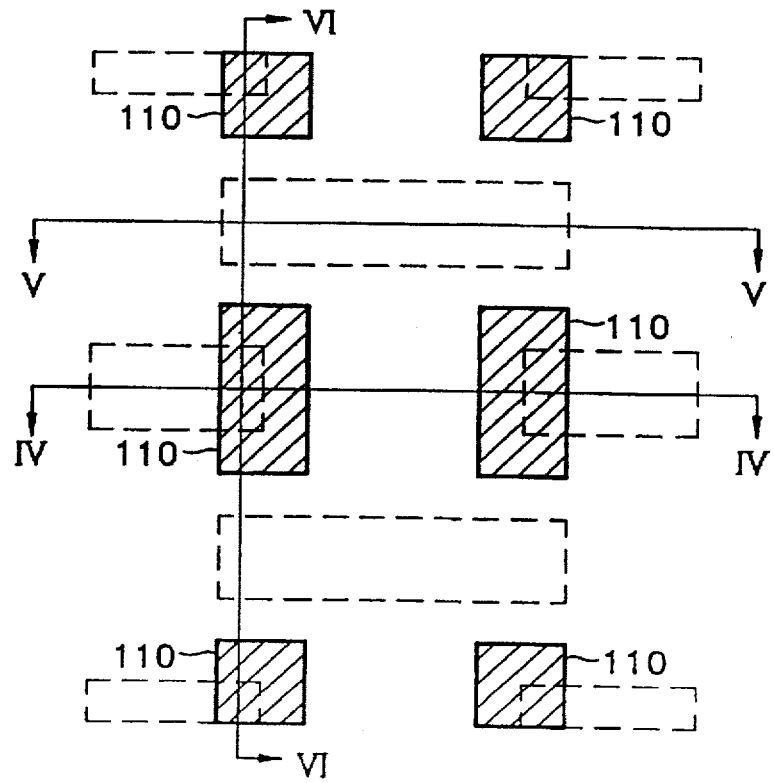
Figure 3C:
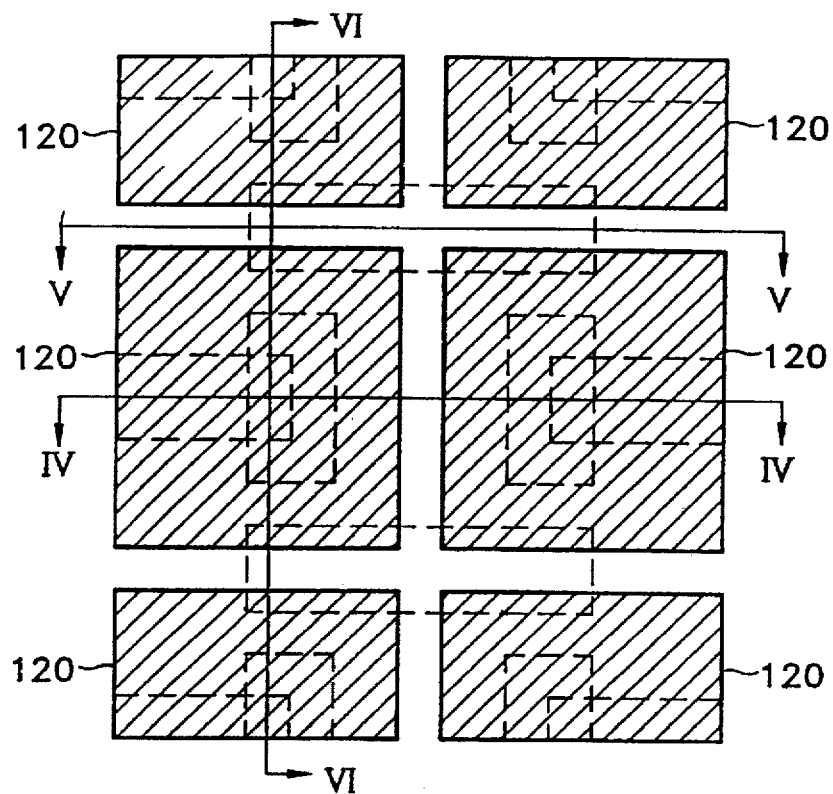
Figure 3D:
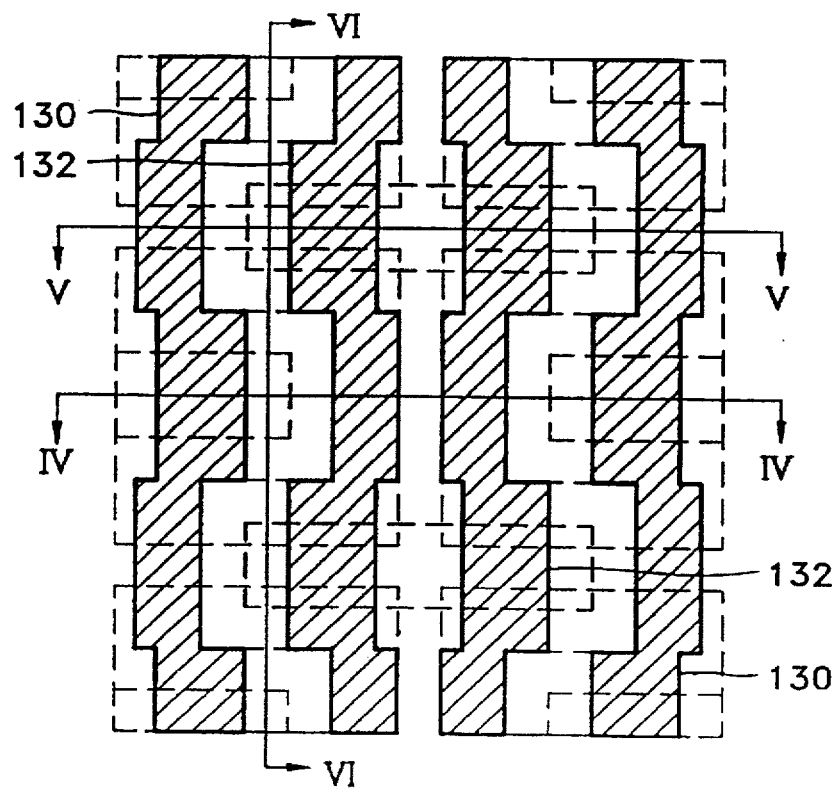
Figure 3E:
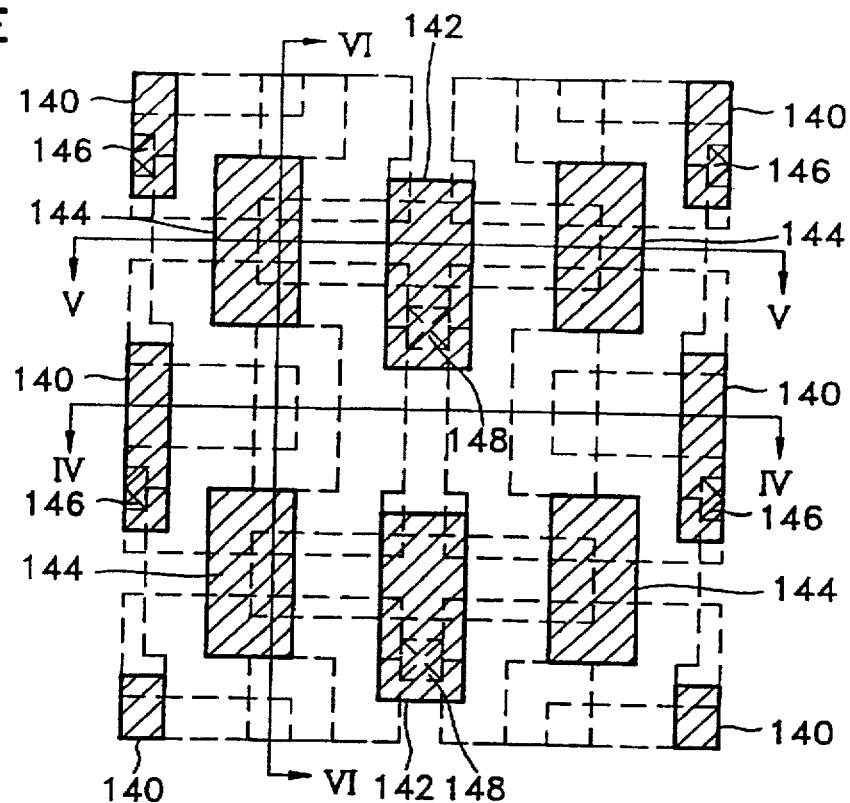
Figure 7:
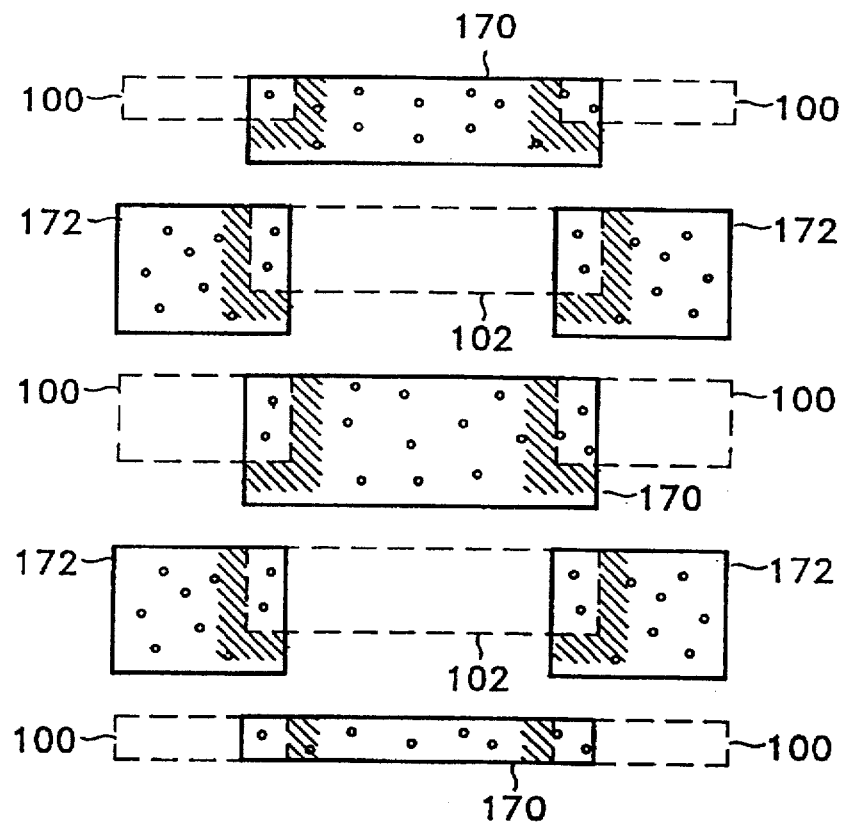
FIG. 7 is layout showing a method for manufacturing a DRAM having capacitors formed above and below a cell transistor, according to a second embodiment of the present invention.
Figure 8:
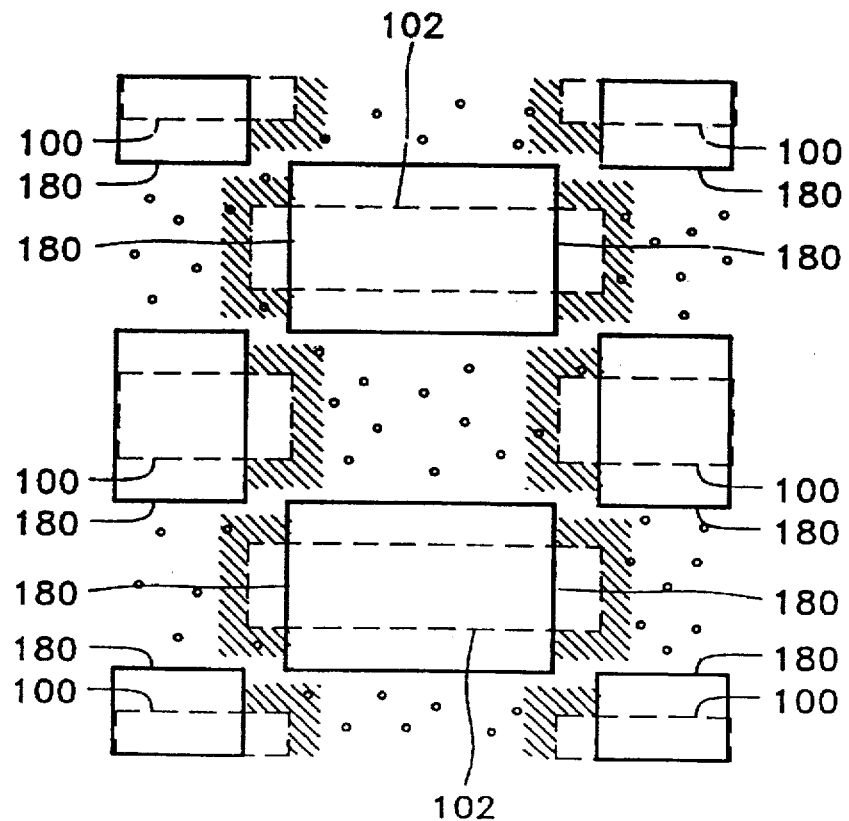
FIG. 8 is layout showing a method for manufacturing a DRAM having capacitors formed above and below a cell transistor, according to a third embodiment of the present invention.

Besides the shape shown in FIG. 3A, mask patterns 104 and 106 can be alternatively patterned, for example, as mask patterns 170 and 172 of FIG. 7 or mask pattern 180 of FIG. 8. According to mask patterns 104 and 106 of FIG. 3A, first and second dummy spacers are formed only on one surface of first and second active insulation film patterns. However, according to the mask pattern shown in FIG. 7 and FIG. 8, the first and second insulation spacers can be formed on two or three surfaces. As a result, the contact area of the storage electrode can be broadened. Thus, contact resistance between the storage electrode and the source is decreased and memory cell characteristics can be enhanced.

An undoped polysilicon is employed as the material constituting the first material layer. If a conductive material, for example, an impurity-doped polysilicon, is employed, the impurity doped in the polysilicon is diffused into first substrate 10. Thus, the impurity becomes doped into the region where the source and drain are not to be formed, which causes problems.

A material having an excellent etching selectivity to a material constituting the first insulation film and a device separating film (described in a later process) can be employed instead of an undoped polysilicon.

FIGS. 3B, 4B, 5B and 6B show the step of forming device separating film 22, material layers for forming a first storage electrode and contact hole 31 for connecting the first storage electrode to first spacer 21. The process sequence includes the steps of: (a) removing the etching preventing film pattern (reference numeral 20 of FIG. 4A); (b) forming a third insulation film over the entire resultant structure; (c) etching back the third insulation film so as to leave the third insulation film only inside the trench, to thereby form device separating film 22; (d) removing the first and second dummy spacers exposed by step (c); (e) removing the thermal oxide film (reference numeral 16 of FIG. 4A); (f) depositing a first conductive material layer over the entire resultant structure and performing an etch back where a surface of device separating film 22 is used as an end point, to thereby form first and second spacers 21 and 23 consisting of the first conductive material layer; (g) sequentially forming fourth insulation film 24, fifth insulation film 26, second conductive material layer 28 and sixth insulation film 30 over the entire resultant structure; (h) performing an etching process where fourth, fifth, sixth insulation films 24, 26 and 30 and second conductive material layer 28 are used as an etching objective and mask pattern 110 is employed, to thereby form contact hole 31 for connecting the first storage electrode to first space 21; and (i) forming third conductive material layer 32 over the entire resultant structure.

Here, as the third insulation film, an oxide film formed by a chemical vapor deposition (CVD) method is employed. The etch back process adopting a chemical mechanical polishing (CMP) method is performed by using the second insulation film that constitutes the active insulation film patterns 13 and 15 as an end point. The step (d) is performed by a chemical dry etching (CDE) method or plasma etching method. The first conductive material layer that constitutes spacers 21 and 23 is formed by depositing a conductive material, for example, an impurity-doped polysilicon. Fourth insulation film 24 is formed by depositing an insulation material, for example, silicon nitride (SiN), to a thickness of about 200 Å. Fifth insulation film 26 is formed by depositing an oxide film to a thickness of about 1,000 Å by employing a CVD method. Second conductive material layer 28 is formed by depositing a conductive material, for example, an impurity-doped polysilicon, to a thickness of about 3,000 Å. Sixth insulation film 30 is formed by depositing an oxide film to a thickness of about 1,000 Å by employing a CVD method. In addition, third conductive material layer 32 is formed by depositing a conductive material, for example, an impurity-doped polysilicon, to a thickness of about 3,000 Å to 5,000 Å.

Fifth insulation film 26 is formed for forming an undercut (to be explained later) at the bottommost surface of a storage electrode, and fourth insulation film 24 is formed to prevent a lower material layer (for example, the device separating film 22 or active insulation film pattern 13 and 15) from being damaged during the process of forming the undercut. Third conductive material layer 32 is connected to first spacer 21 via the contact hole.

As shown by FIGS. 3C, 4C, 5C and 6C, a process sequence for forming first storage electrode 200 includes the steps of (a) forming photo-sensitive film pattern 33 for forming a first storage electrode on the resultant structure by employing mask pattern 120 and (b) performing an etching employing photo-sensitive film pattern 33 as an etching mask, to thereby form first storage electrode 200.

Here, photo-sensitive film pattern 33 is defined by cell units, centering around a source (to be formed on a first substrate connected to first spacer 21) of a first transistor. In addition, the second conductive layer (reference numeral 28 of FIG. 4A) and the third conductive layer (reference numeral 32 of FIG. 4B) are etched using photo-sensitive film 33 as an etching mask, and whole fifth insulation film (reference numeral 26 of FIG. 4A) and sixth insulation film (reference numeral 30 of FIG. 4A) are etched in the etching process of step (b).

Figure 4A:
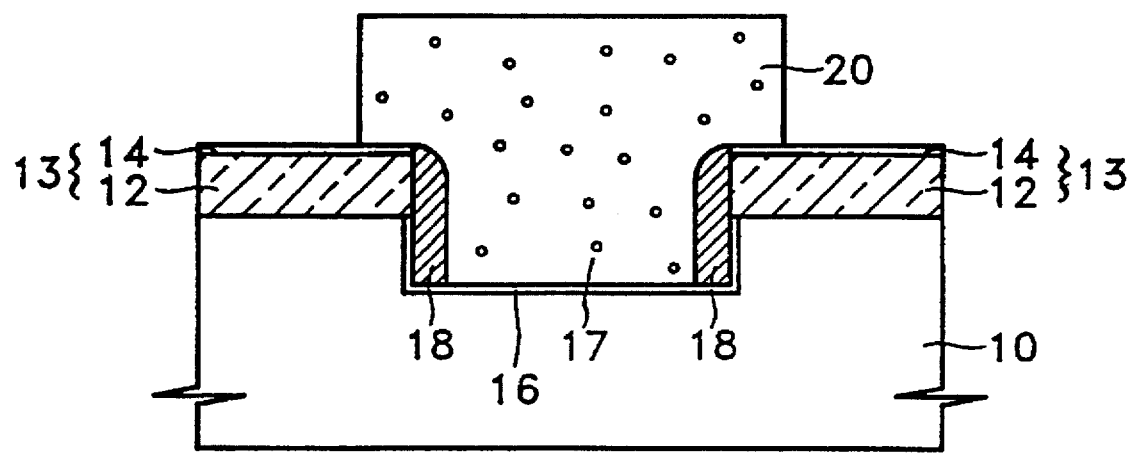
FIGS. 4A–4G are section views taken along line IV—IV of FIGS. 3A–3G, respectively.
Figure 4B:
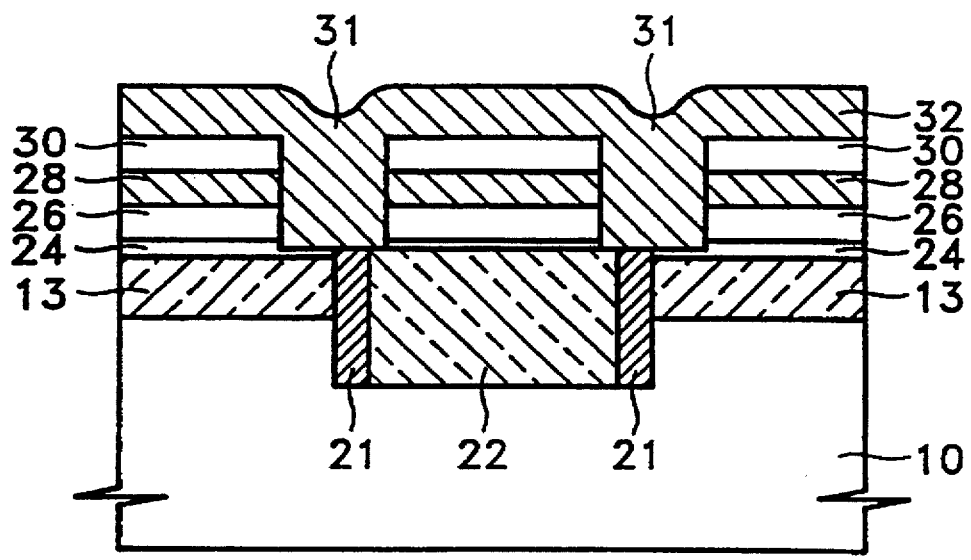
Figure 4C:
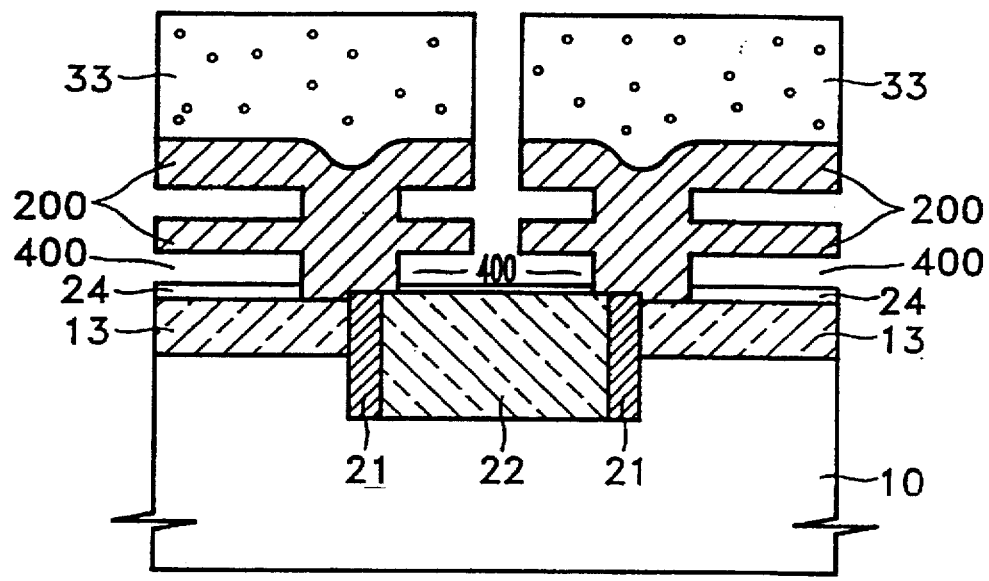
Figure 4D:
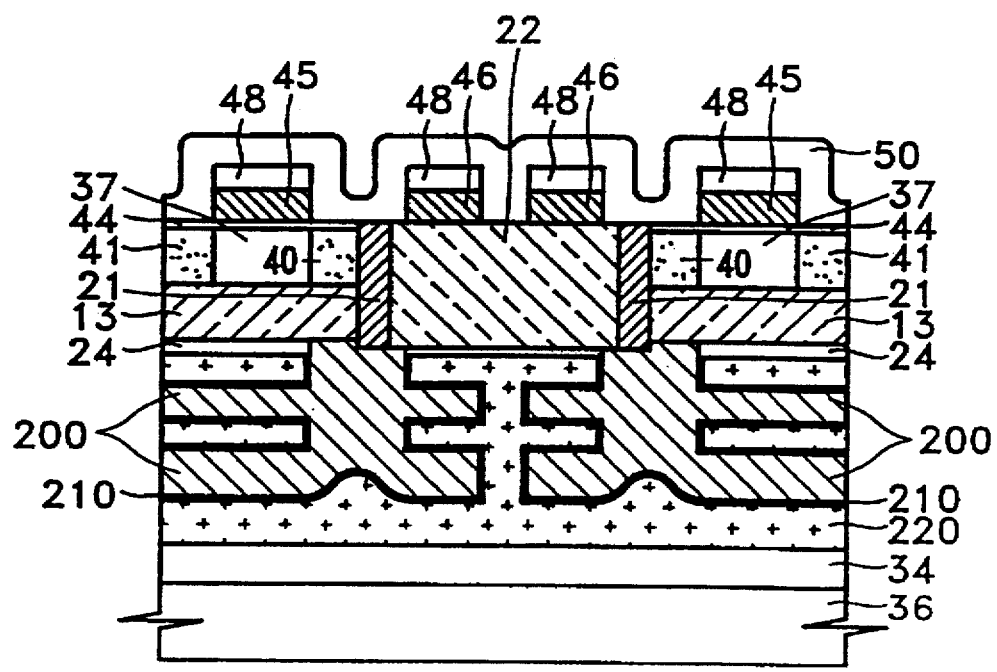
Figure 4E:
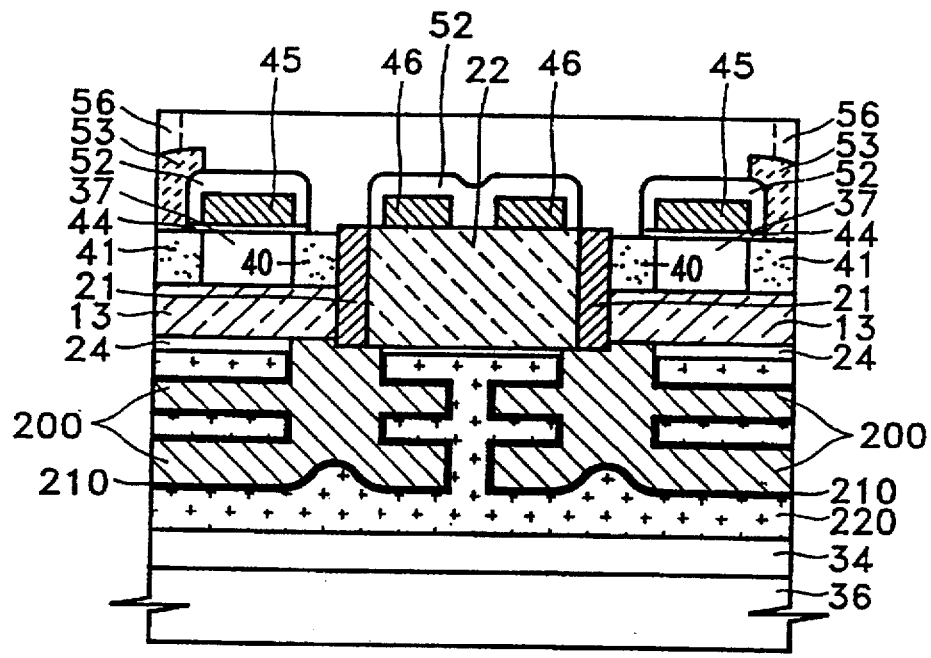
Figure 4F:
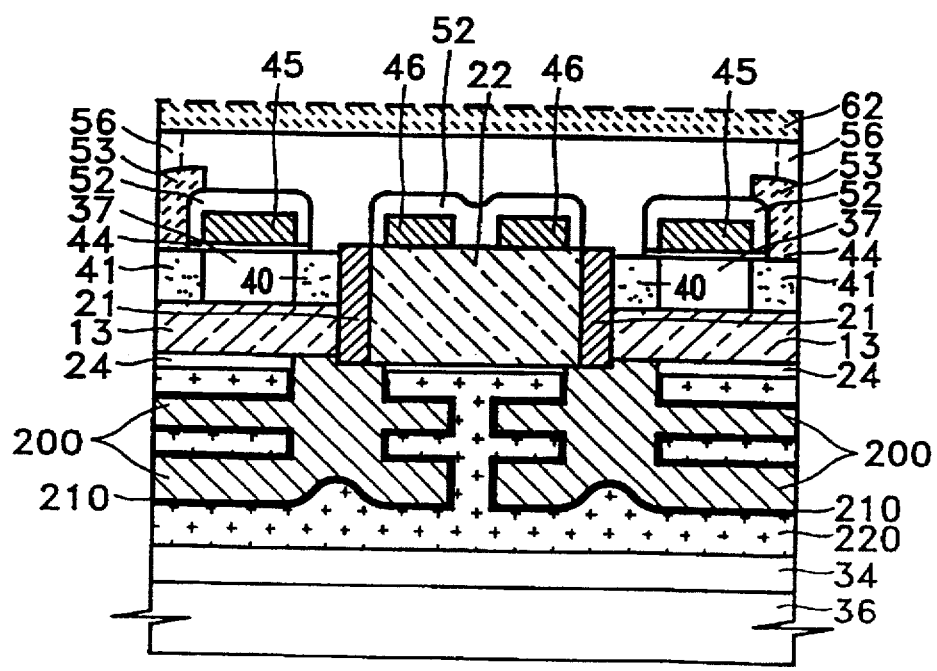
Figure 4G:
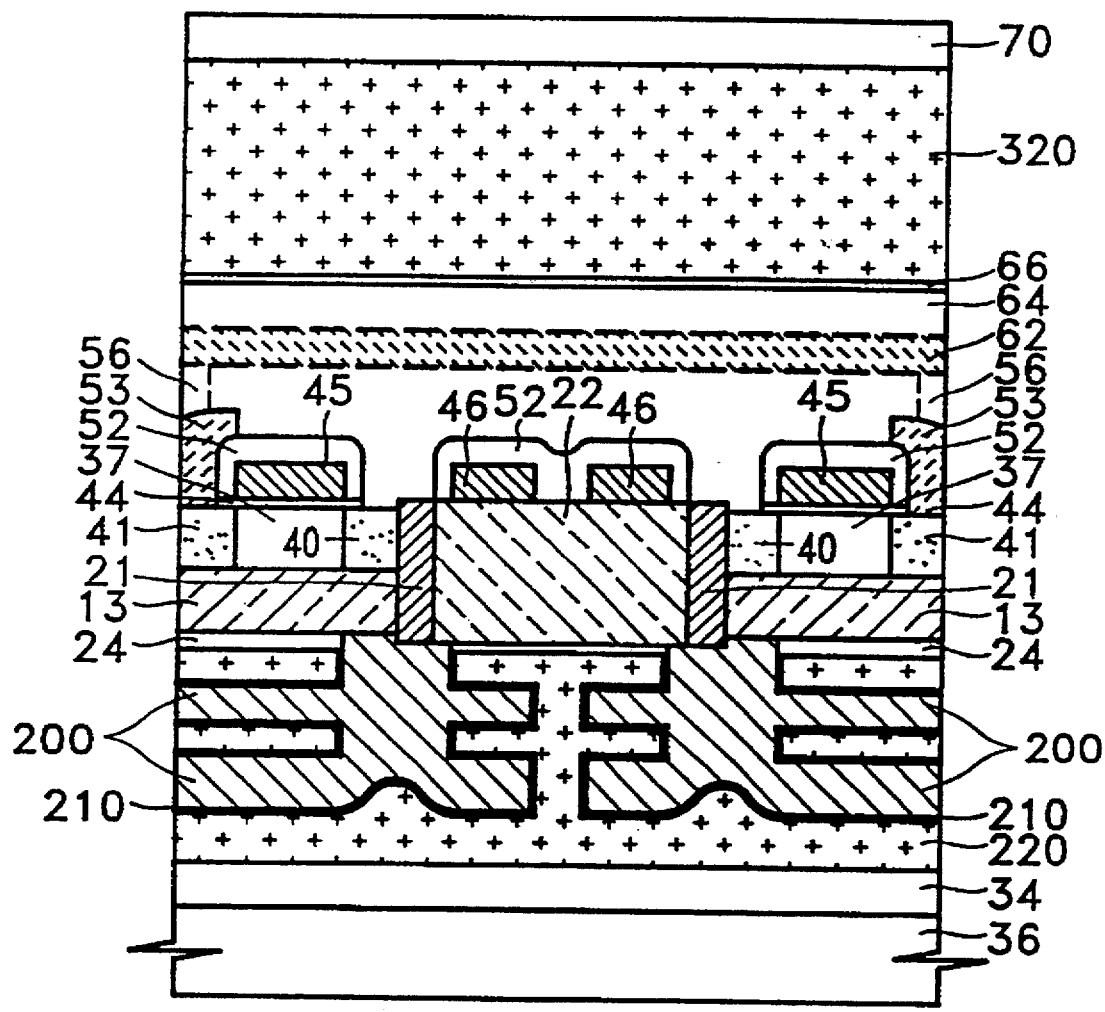
Figure 6A:
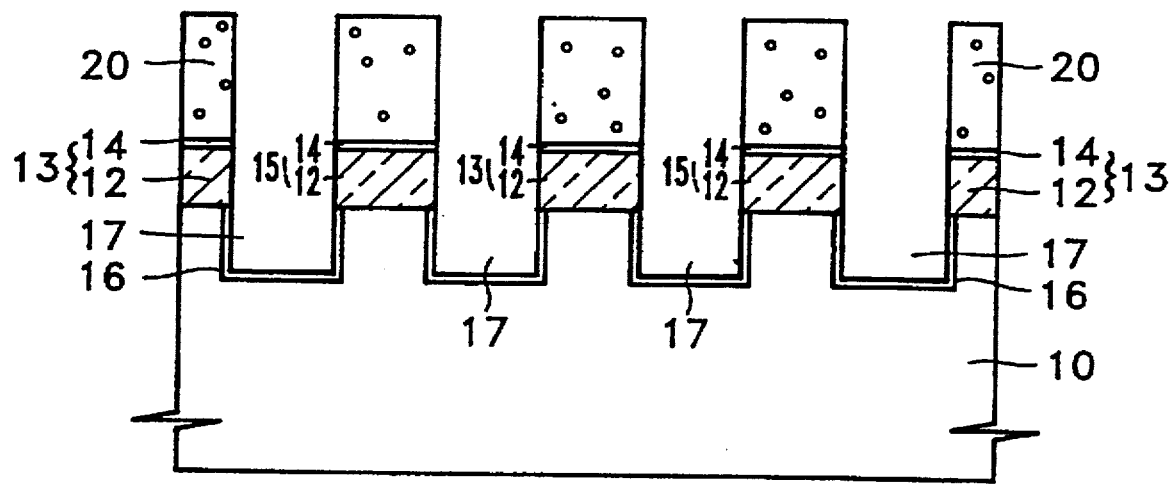
FIGS. 6A–6G are section views taken along line VI—VI of FIGS. 3A–3G, respectively.
Figure 6B:
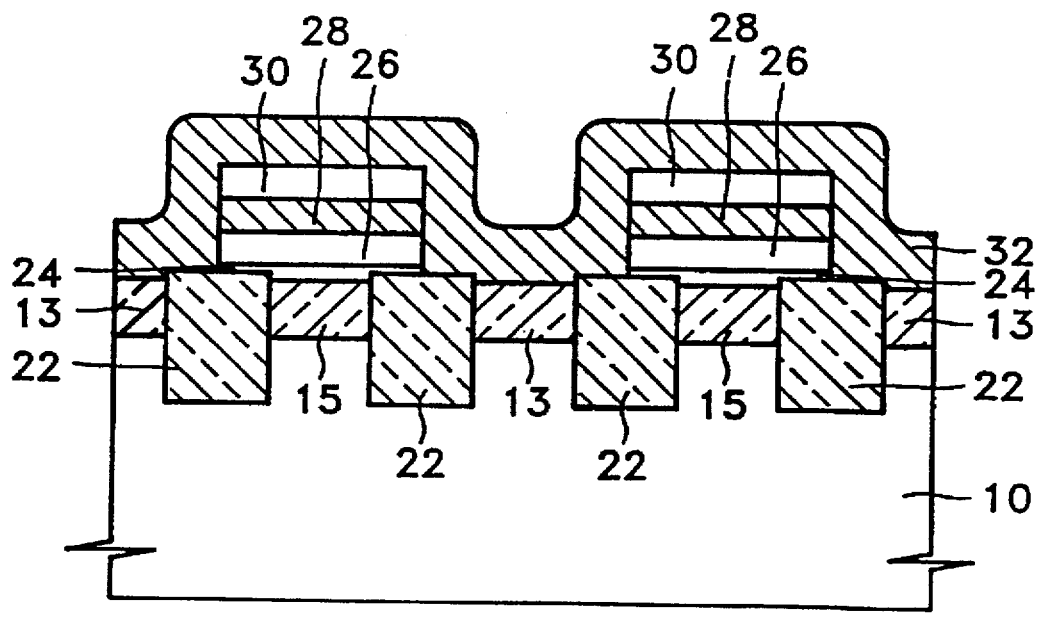
Figure 6C:
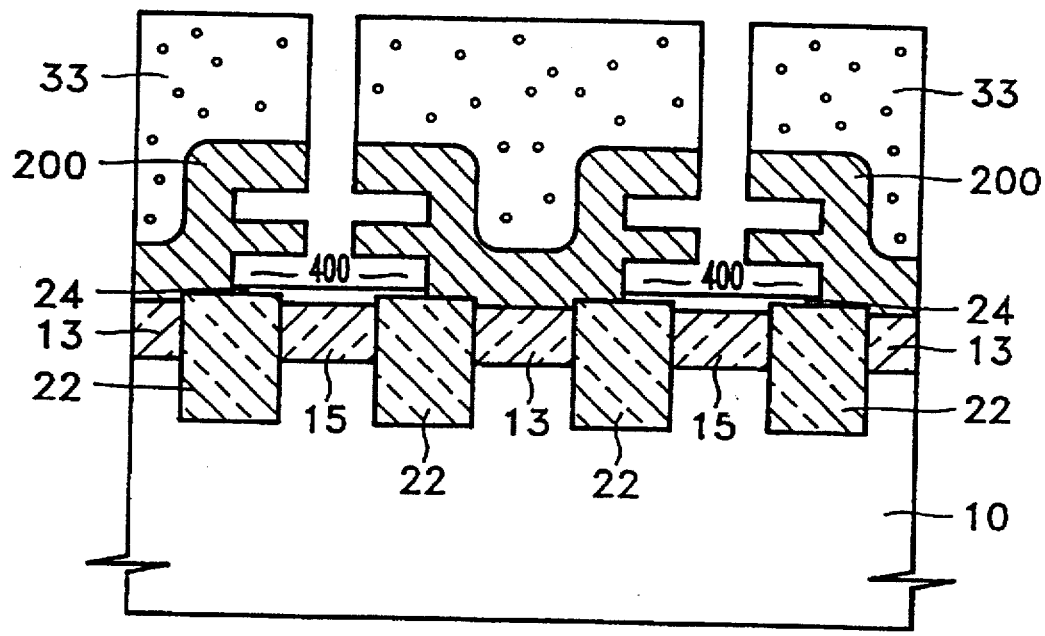
Figure 6D:
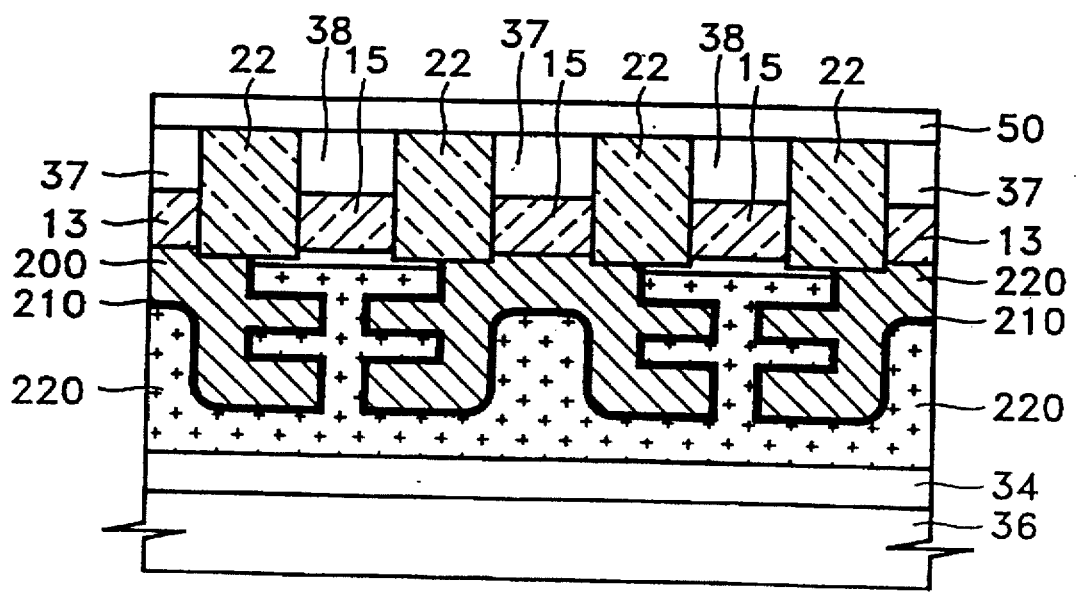
Figure 6E:
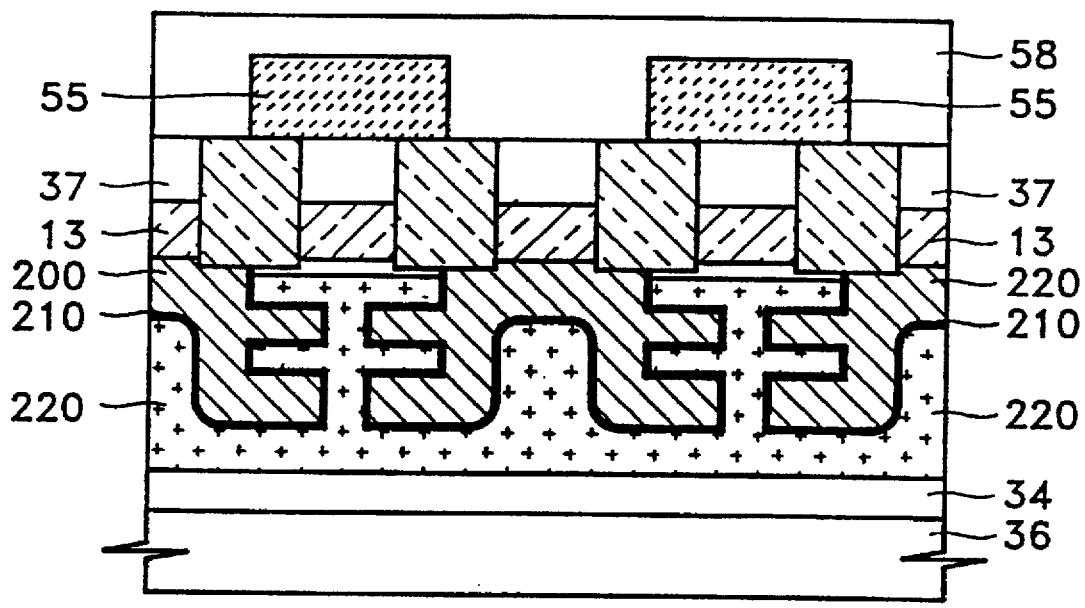
Figure 6F:
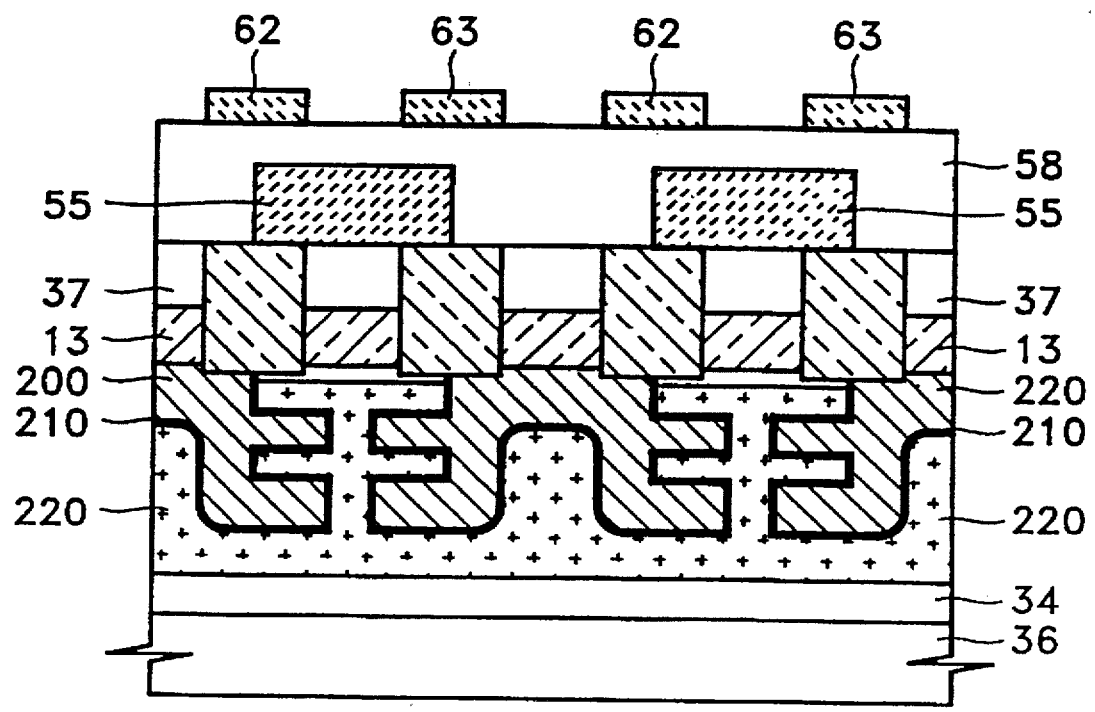
Figure 6G:
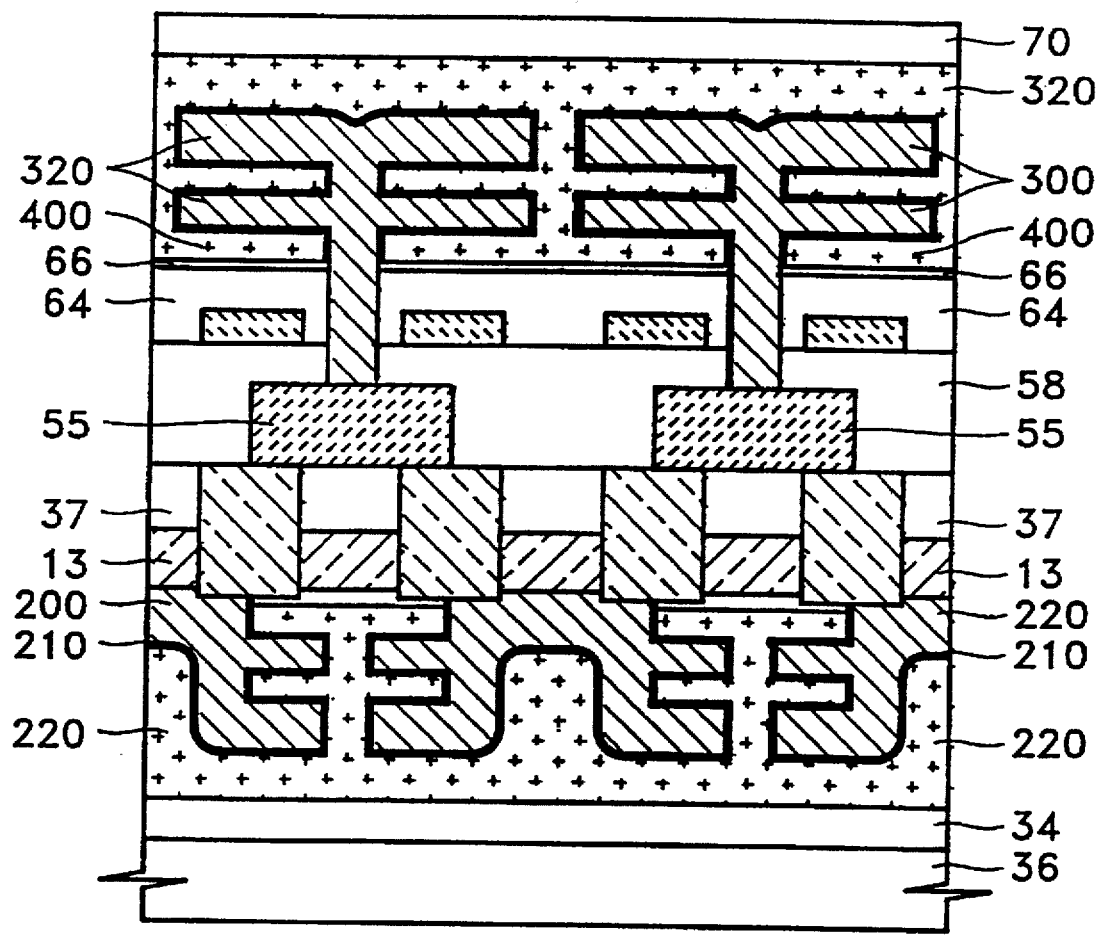

As shown in FIG. 4C and FIG. 6C, an undercut (uc) is formed at the bottommost surface of first storage electrode 200 by eliminating the fifth insulation film. Here, fourth insulation film 24 prevents a lower material layer from being damaged during the elimination of the fifth insulation film.

As shown by FIGS. 3D, 4D, 5D and 6D, a process sequence for forming first capacitors 200, 210 and 220, second substrate 36, first transistors 40, 41 and 45 and second transistors 42, 43 and 46 includes the steps of: (a) eliminating the photosensitive film pattern (reference numeral 33 of FIG. 4C) and forming first dielectric film 210 over the entire first storage electrode 200; (b) forming a fourth conductive material layer over the entire resultant structure and etching back the resultant structure, to thereby form first plate electrode 220 having a planarized surface; (c) forming seventh insulation film 34 over the entire resultant structure; (d) bonding second substrate 36 onto the resultant structure; (e) turning the resultant structure upside down so that second substrate 36 is oriented towards the bottom; (f) performing an etching back using a surface of device separating film 22 as an end point and first substrate 10 as an etching objective and respectively forming first and second active regions 37 and 38 consisting of first substrate on first and second active insulation film patterns 13 and 15; (g) forming gate oxide film 44 on surfaces of first and second active regions 37 and 38; (h) forming a fifth conductive material layer and eighth insulation film 48 over the entire resultant structure and performing an etching employing mask patterns 130 and 132, to thereby form first gate electrode 45 traversing first active region 37 and second gate electrode 46 traversing second active region 38; (i) performing an impurity doping process to the entire resultant structure and forming first source 40 and first drain 41 constituting the first transistor and second source 42 and second drain 43 constituting the second transistor; and (j) forming ninth insulation film 50 over the entire resultant structure.

Here, first plate electrode 220 is formed by depositing a conductive material, for example, an impurity-doped polysilicon, to a thickness of about 2,000 Å. An oxide film is employed as a material for constituting seventh insulation film 34. The etch-back process performed in the step (e) adopts a polishing method, for example, CMP. The fifth conductive material layer constituting first and second gate electrodes 45 and 46 is made up of a conductive material, for example, an impurity-doped polysilicon. First source 40 and first drain 41 are self-aligned to first gate electrode 45. Second source 42 and second drain 43 are self-aligned to second gate electrode 46 and their bottom surfaces contact surfaces of active-insulation film patterns 13 and 15. Eighth and ninth insulation films 48 and 50 consist of a pure oxide film where an impurity is not doped.

As shown by FIGS. 3E, 4E, 5E, and 6E, a process sequence for forming first pad 53, second pad 54, third pad 55, first contact hole 56 and second contact hole 57 includes the steps of: (a) performing an anisotropic etching process on ninth insulation film (reference numeral 50 of FIG. 4D) to thereby form protection film 52 for insulating first and second gate electrodes 45 and 46 from another conductive layer and form a contact hole for connecting a first bit line, a second bit line and a second storage electrode to first drain 41, second drain 43 and second source 42, respectively; (b) forming a sixth conductive material layer over the entire resultant structure, and performing a photo-etching process employing the sixth conductive material layer as an etching objective and employing mask pattern 140, 142 and 144, to thereby form first pad 53 connected with first drain 41, second pad 54 connected with second drain 43 and third pad 55 connected with second source 42; (c) forming tenth insulation film 58 over the entire resultant structure and planarizing the result; and (d) performing a photo-etching process employing the tenth insulation film as an etching objective and by employing mask patterns 146 and 148, to thereby form first contact hole 56 for partially exposing first pad 53 and second contact hole 57 for partially exposing second pad 54.

Here, sixth conductive material layer that constitutes the pads 53, 54 and 55 is formed by depositing an impurity-doped polysilicon to a thickness of about 1,000 Å. Tenth insulation film 58 is formed by depositing an insulation material, for example, oxide film, to a thickness of about 2,000 Å to 3,000 Å by employing a CVD method.

The pads 53, 54 and 55 are formed in order to reduce a contact failure by means of lowering the aspect ratio (contact hole height to width) of contact holes 56 and 57 when connecting the transistor to bit lines and a second storage electrode which is to be formed in the sequent process, respectively.

As shown by FIGS. 3F, 4F, 5F and 6F a process sequence for forming first bit line 62 and second bit line 63 includes the steps of: (a) forming a seventh conductive material layer over the entire resultant structure where the first and second contact holes 56 and 57 are formed; and (b) performing an etching process employing the seventh conductive material layer as an etching objective and employing mask patterns 150 and 152, to thereby form first bit line 62 connected to first drain 41 via first pad 53 and second bit line 63 connected to second drain 43 via second pad 54.

Figure 3F:
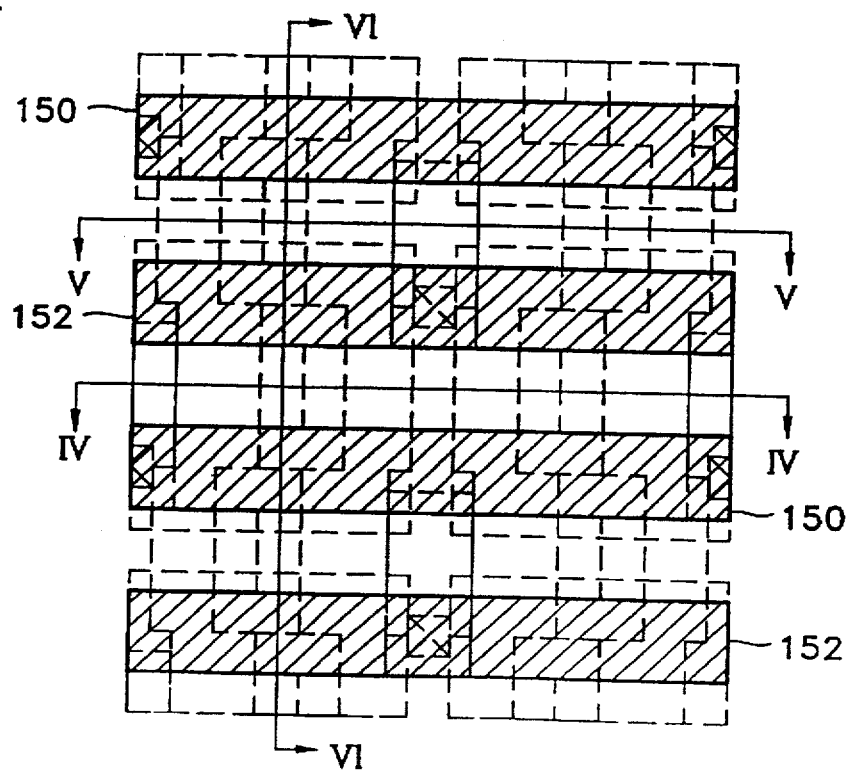

Here, the seventh conductive material layer is formed by a conductive material, for example, an impurity-doped polysilicon. First and second bit lines 62 and 63 are formed between the active regions 37 and 38 (FIG. 3F).

As shown by FIGS. 3G, 4G, 5G and 6G, a process sequence for forming second capacitors 300, 310 and 320 includes the steps of: (a) forming eleventh insulation film 64 having a planarized surface over the entire resultant structure where first and second bit lines 62 and 63 are formed; (b) sequentially forming twelfth insulation film 66, thirteenth insulation film, an eighth conductive material layer and a fourteenth insulation film on eleventh insulation film 64; (c) performing an etching process employing a material layer formed on third pad 55 as an etching objective and employing mask pattern 160, to thereby form third contact hole 68 for exposing third pad 55; (d) forming a ninth conductive material layer over the entire resultant structure and performing an etching process using a material layer formed on twelfth insulation film 66 as an etching objective and employing mask pattern 162, to thereby form second storage electrode 300; (e) forming second dielectric film 310 on a surface of second storage electrode 300; (f) forming a tenth conductive material layer over the entire resultant structure so as to form second plate electrode 320 and planarizing the surface of second plate electrode 320; and (g) forming fifteenth insulation film 70 over the entire resultant structure.

Here, eleventh insulation film 64 is formed by depositing an insulation material, for example, oxide film, to a thickness of about 2,000 Å to 3,000 Å. Twelfth insulation film 66 is formed by depositing silicon nitride (SiN) to a thickness of about 300 Å to 500 Å. The thirteenth and fourteenth insulation films are formed by depositing an insulation material, for example, oxide film, by a CVD method. The eighth and ninth conductive material layers are formed by depositing a conductive material, for example, an impurity-doped polysilicon. The tenth conductive material layer is formed by depositing a conductive material, for example, an impurity-doped polysilicon, to a thickness of about 2,000 Å. Fifteenth insulation film 70 is formed by an insulation material, for example, an oxide film.

Figure 5A:
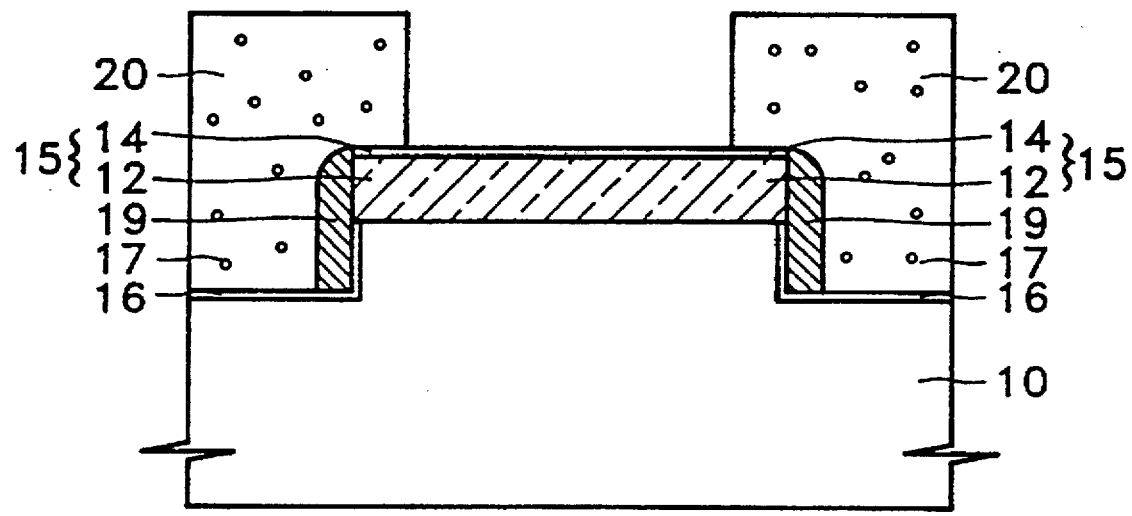
FIGS. 5A–5G are section views taken along line V—V of FIGS. 3A–3G, respectively.
Figure 5B:
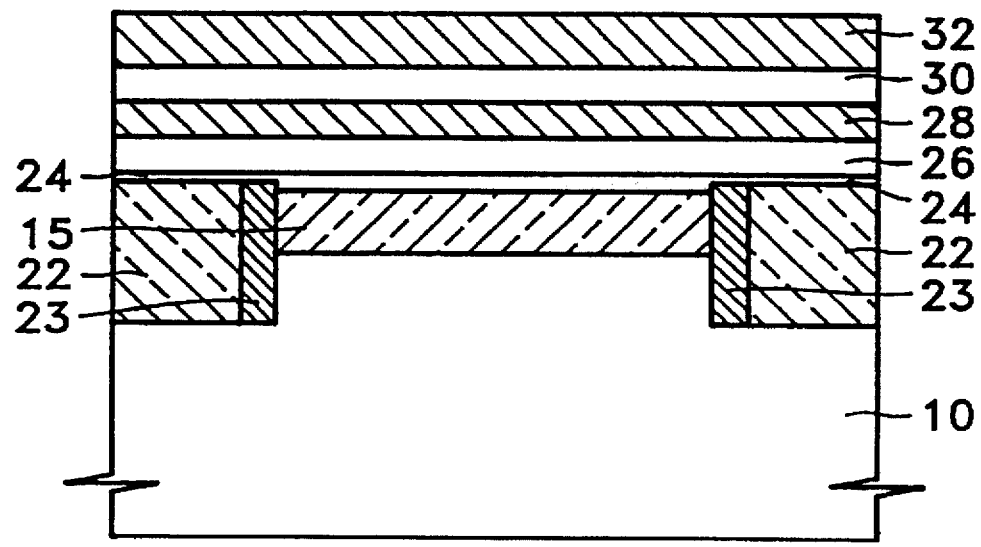
Figure 5C:
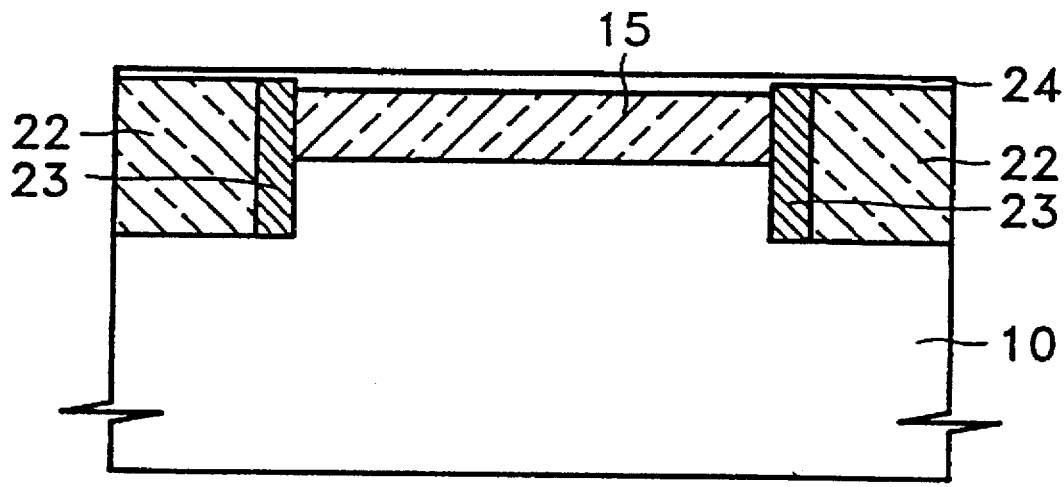
Figure 5D:
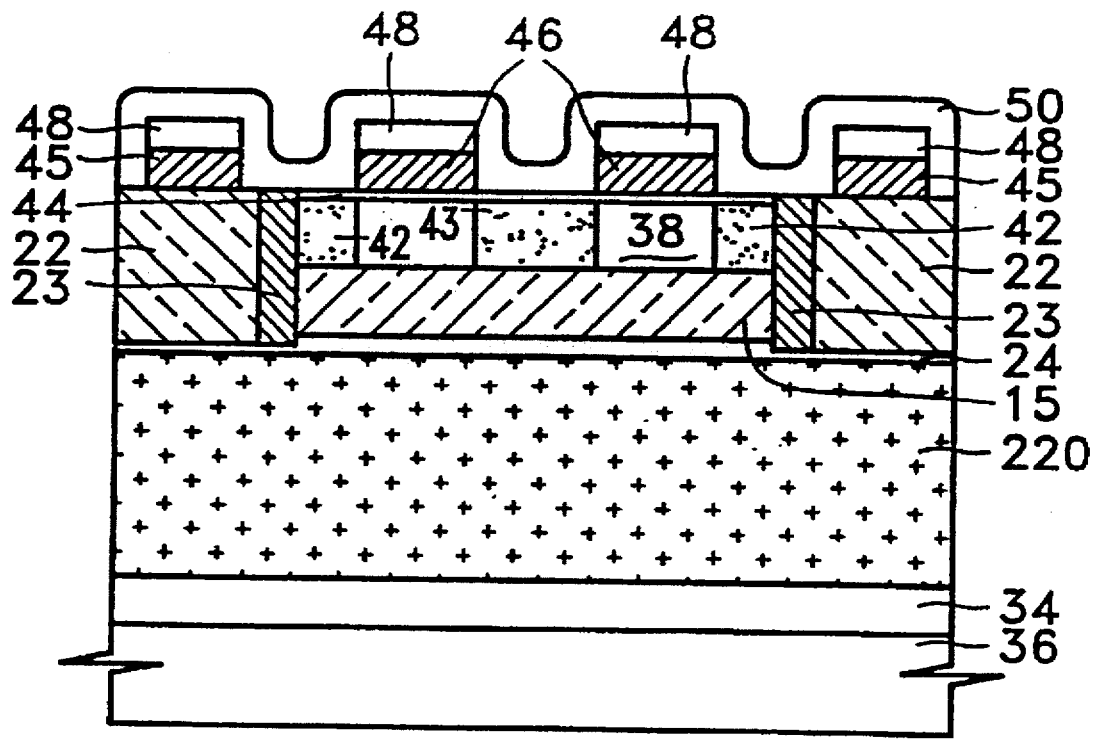
Figure 5E:
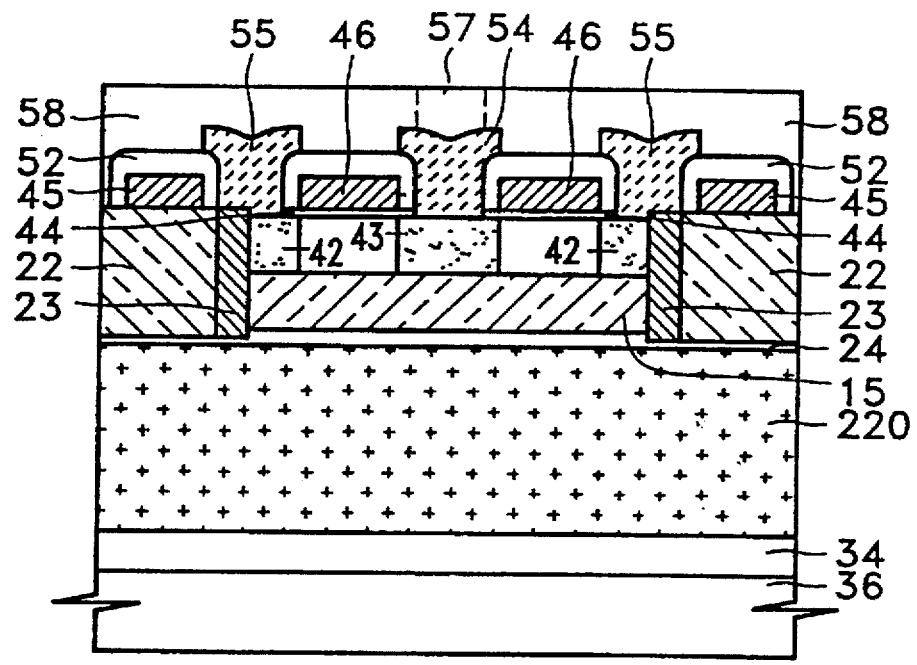
Figure 5F:
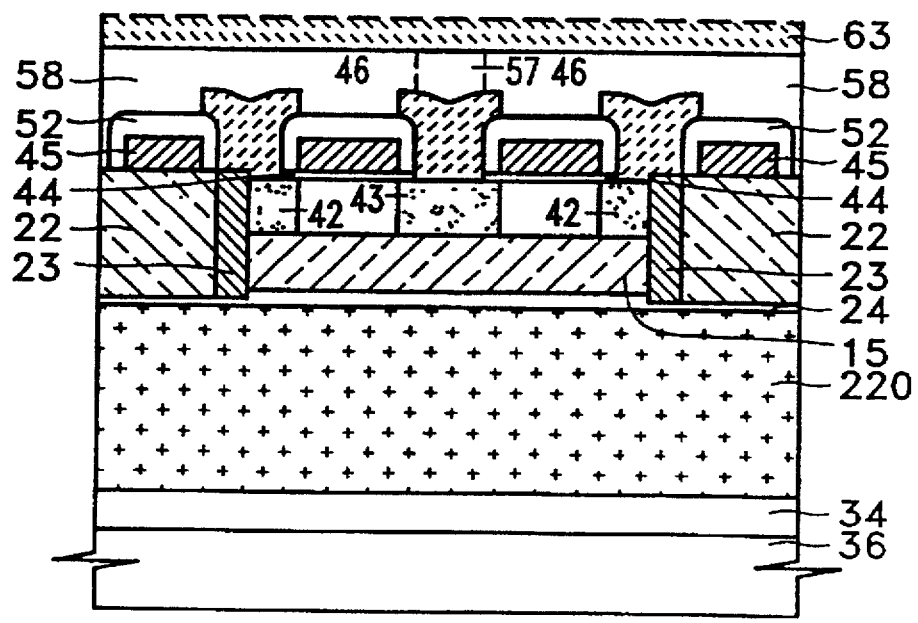
Figure 5G:
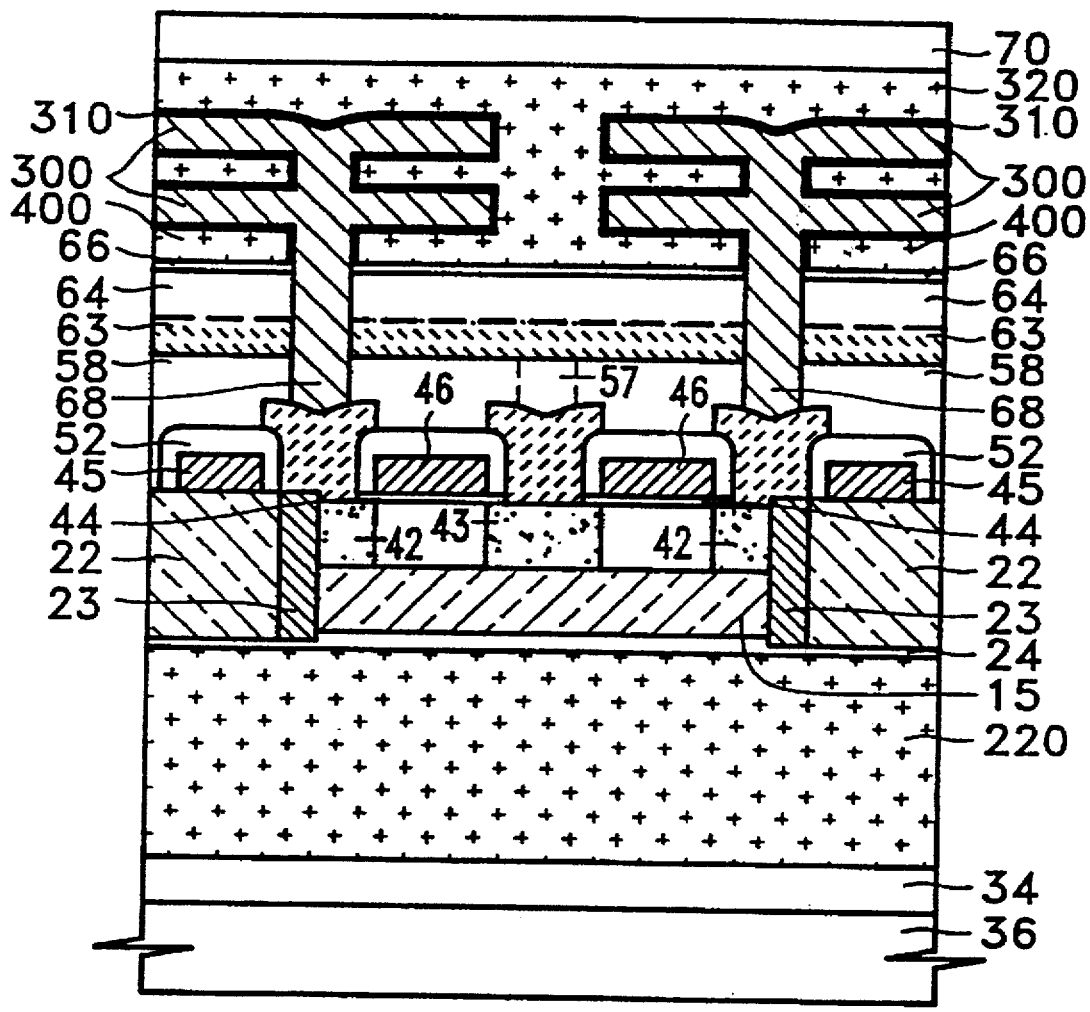

As shown by FIG. 5G second storage electrode 300 is connected to second source 42 via third pad 55, and undercut 400 is formed at the bottommost surface of second storage electrode 300, as in the case of first storage electrode 200. Here, twelfth insulation film 66 prevents an underlying material layer beneath the thirteenth insulation film from being damaged by the eliminating process of the thirteenth insulation film.

Figure 3G:
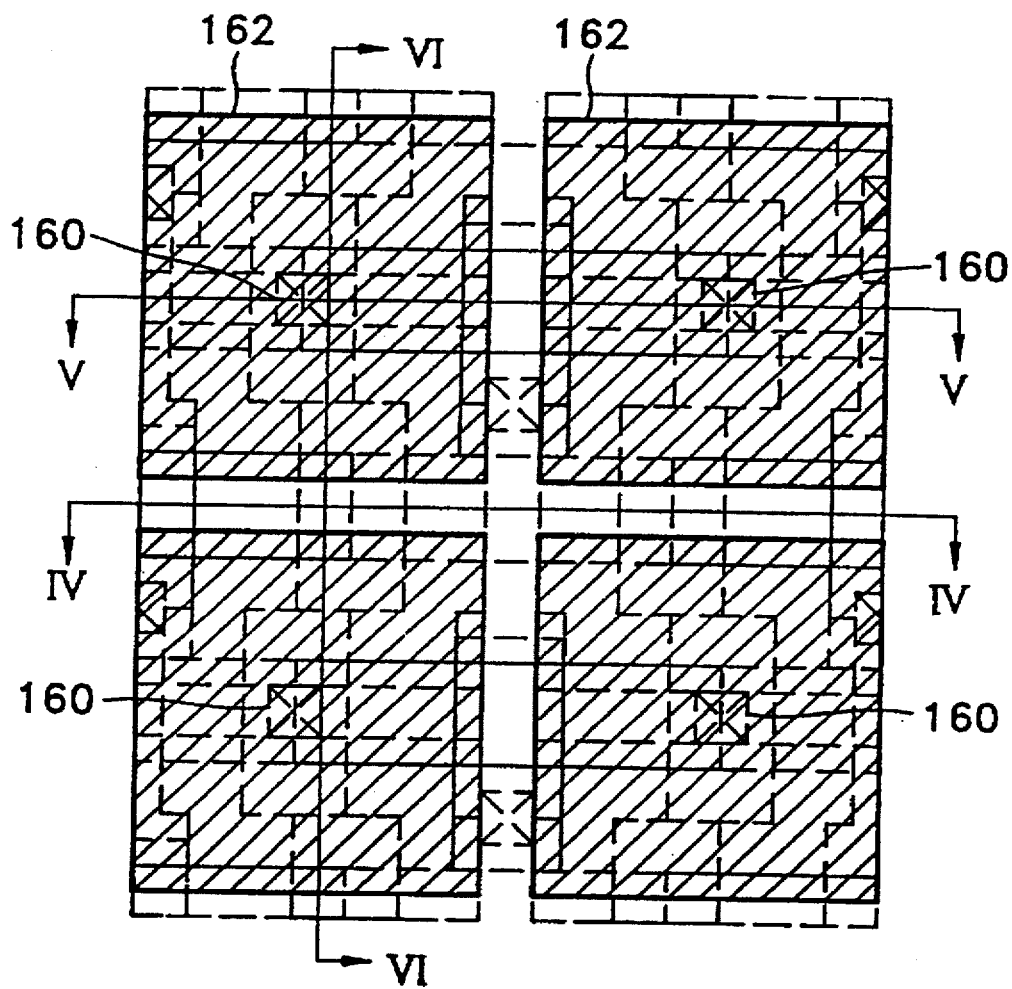

As shown by FIG. 3G, mask pattern 162 is used for forming a second storage electrode and partially overlaps the mask pattern (reference numeral 120 of FIG. 3C) for forming the first storage electrode.

The first embodiment of the present invention has several distinct advantages.

First, cell capacitors are formed respectively above and below the cell transistor. Thus, cell capacitances can be obtained with at least twice that of a conventional method which forms a cell capacitance only above or below a cell transistor.

Second, since the storage electrode and source are connected by employing a spacer formed on the sidewalls of the source, a gate electrode covers more of an active region than in a conventional method that connects a storage electrode with the source via a contact hole. As a result, transistor short-channel effects are reduced.

Third, since an undercut is formed at the bottommost surface of each storage electrode, it is not the storage electrode which undergoes repeated charging and discharging but a plate electrode at a fixed voltage that faces a cell transistor. Thus, cell transistor characteristics can be prevented from destabilization by the charge/discharge action of the storage electrode.

FIG. 7 and FIG. 8 are layouts showing a method for manufacturing a DRAM having a buried capacitor corresponding to the second and third embodiments of the present invention. As shown in FIG. 3A, first and second spacers may be formed not only on one surface of an active insulation film pattern and but also on two (hatched portion of FIG. 7) or three surfaces (hashed portion of FIG. 8). In FIG. 7 and FIG. 8, the same reference numerals as those of FIG. 3A denote the same mask patterns.

According to second and third embodiments, since area of first and second spacers connected to first and second storage electrodes can be extended, a contact characteristic between the first and second storage electrodes and the first and second sources is improved compared with the first embodiment.

Figure 9:
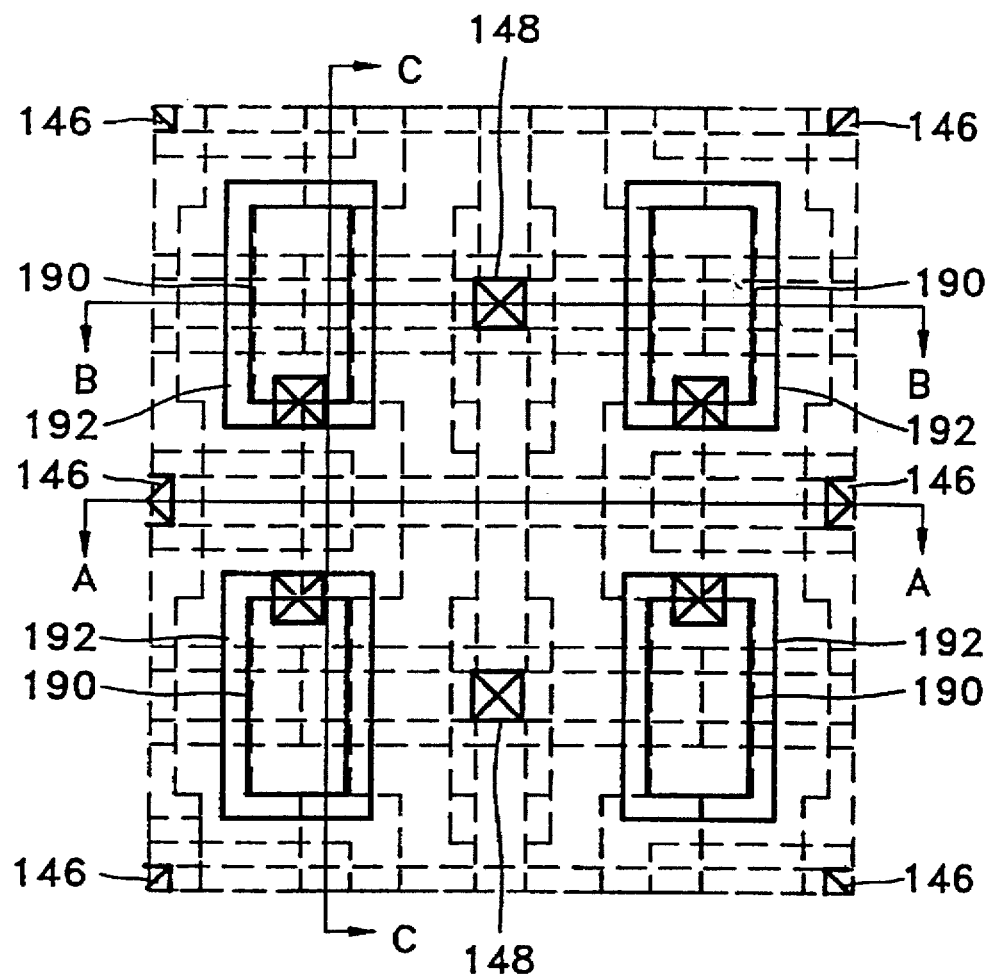
FIG. 9 is layout showing a method for manufacturing a DRAM having capacitors formed above and below a cell transistor, according to a fourth embodiment of the present invention.

FIG. 9 is a layout showing a method for manufacturing a DRAM having a buried capacitor according to the forth embodiment of the present invention. The method connects first and second bit lines directly to the drain of a transistor without using a pad. Here, reference numeral 190 denotes a mask pattern for forming a contact hole for connecting a third pad with second source, and reference numeral 192 denotes a mask pattern for forming a third pad. Here, the same reference numerals as those of FIGS. 3E–3G denote the same mask patterns.

Figure 10A:
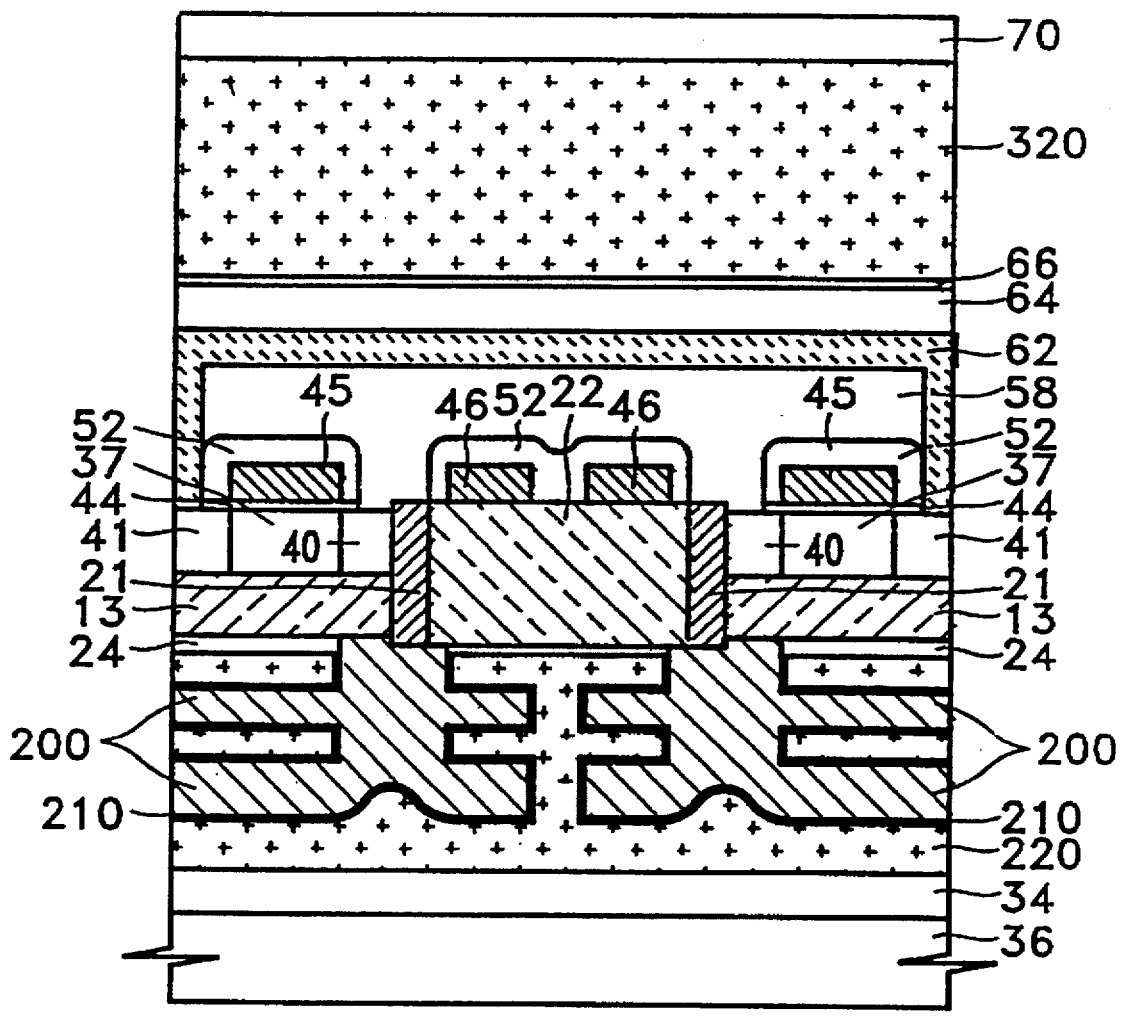
FIGS. 10A–10C are section views taken along lines AA, BB and CC of FIG. 9, respectively.
Figure 10B:
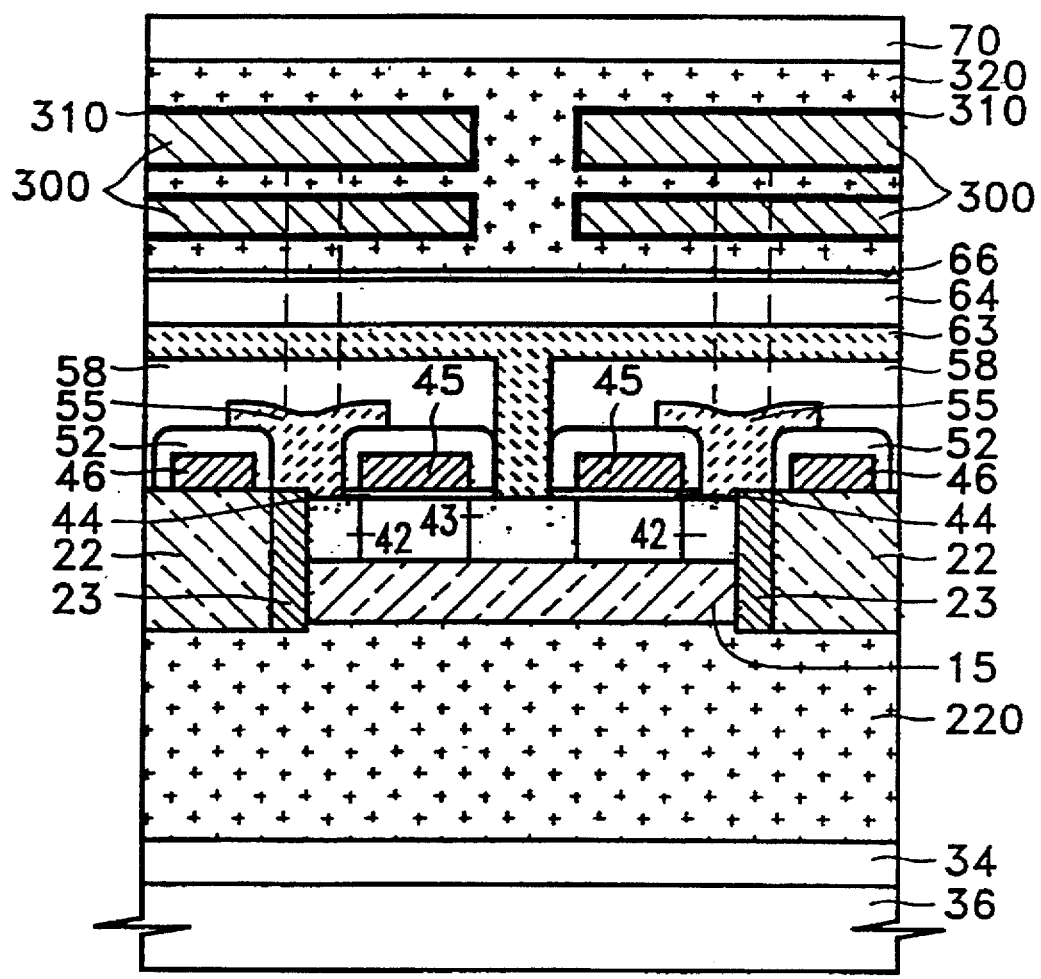
Figure 10C:
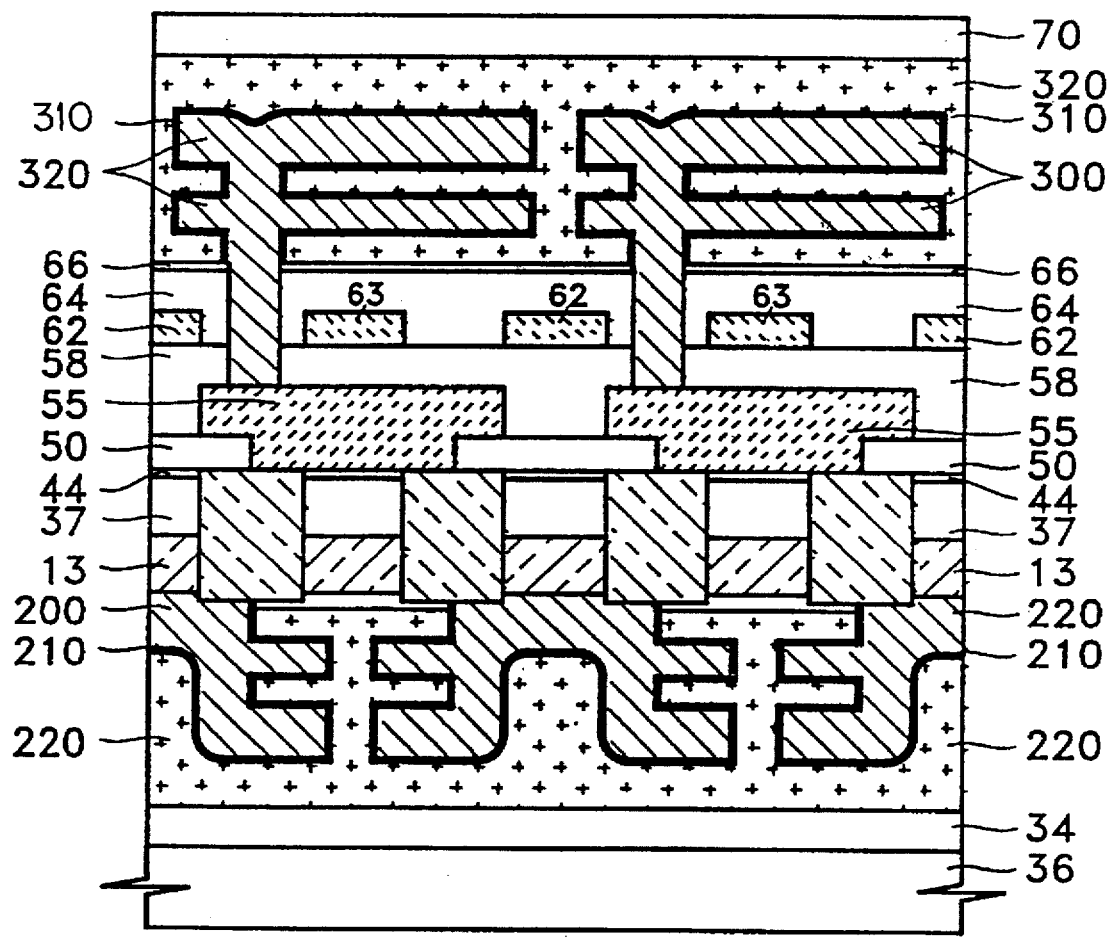

FIGS. 10A–10C are section views, taken along lines AA, BB and CC of FIG. 9, respectively. As shown by FIGS. 10A–10C, after the process of FIGS. 3D, 4D, 5D and 6D for forming ninth insulation film 50, the process sequence includes the steps of: (a) performing an etching process employing mask pattern 190 for forming a contact hole for connecting a third pad with second source and using the ninth insulation film around second source 42 as an etching objective, to thereby expose the second source; (b) forming a sixth conductive material layer over the entire resultant structure and performing an etching process using the sixth conductive material layer as an etching objective employing mask pattern 192 for forming third pad 55 for connecting second storage electrode 300 With second source 42; and (c) eliminating the material deposited on first and second drains 41 and 43, to thereby form a Contact hole for connecting first and second bit lines 62 and 63 to first and second drains and 43, respectively. The subsequent process steps are the same as that of the first embodiment.

Here, like components of FIGS. 10A–10C are denoted by the same reference numerals as those of FIGS. 3A–3G to 6A–6G.

According to a semiconductor memory device of the present invention and a method for manufacturing the same, at least twice the cell capacitance of a conventional method can be obtained. In addition, cell transistor characteristics are stabilized and short-channel effects can be reduced. As a result, the next-generation DRAM chip can be manufactured.

It is further understood by those skilled in the art that the foregoing description is merely a preferred embodiment of the disclosed device and that various changes and modifications may be made in the invention without departing from the spirit and scope thereof.

What is claimed is:

1. A method for manufacturing a semiconductor memory device provided with capacitors formed above and below a cell transistor, comprising the steps of:

(a) forming an insulation film pattern on a first substrate, etching said first substrate by using said insulation film pattern as an etching mask, and forming first and second active regions which are separated from each other and protruded;

(b) depositing a material layer on said first substrate including on the sidewalls of said active regions;

(c) removing portion of said deposited material layer other than on said sidewalls of said active region where a source of a transistor is to be formed, to thereby form a first spacer contacting said first active region and second spacer contacting said second active region;

(d) depositing an insulating material over said first substrate after said step (c) and etching back said insulating material, to thereby fill only a space between said active regions with said insulating material;

(e) forming a first capacitor consisting of a first storage electrode connected to said first spacer, a first dielectric film and a first plate electrode on said first substrate after said strep (d);

(f) planarizing a surface of said first plate electrode;

(g) forming an insulation film on said first plate electrode and bonding second substrate to said insulation film on said plate electrode;

(h) turning said first substrate upside down, etching back said first substrate such that said first and second spacers and active regions can be exposed;

(i) forming first and second transistors on said first and second active regions, respectively; and (j) forming second capacitor consisting of a second storage electrode connected to said second spacer, a second dielectric film and second plate electrode on said first substrate after said step (i).

2. A method for manufacturing a semiconductor memory device provided with capacitors formed above and below a cell capacitor according to claim 1, further comprising a step of respectively forming first and second pads connected to said second spacer and a drain of a transistor, in said step (i).

3. A method for manufacturing a semiconductor memory device provided with capacitors formed above and below a cell transistor according to claim 2, further comprising a step of forming a bit line connected to said second pad and placed between said active regions, in said step of forming first and second pads.

4. A method for manufacturing a semiconductor memory device provided with capacitors formed above and below a cell transistor according to claim 1, further comprising a step of forming a first pad connected to said second spacer, in said step (i).

5. A method for manufacturing a semiconductor memory device provided with capacitors formed above and below a cell transistor according to claim 1, further comprising a step of forming an insulation layer over said first substrate, in each of said steps (d) and (i), said insulation layers being eliminated after formation of said first and second storage electrodes.

* * * * *